United States Patent
Haba

(10) Patent No.: US 8,580,607 B2
(45) Date of Patent: Nov. 12, 2013

(54) MICROELECTRONIC PACKAGES WITH NANOPARTICLE JOINING

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 299 days.

(21) Appl. No.: 12/844,463

(22) Filed: Jul. 27, 2010

(65) Prior Publication Data
US 2012/0025365 A1   Feb. 2, 2012

(51) Int. Cl.
*H01L 21/00* (2006.01)

(52) U.S. Cl.
USPC ............ 438/106; 977/773; 257/E21.499; 257/E23.141

(58) Field of Classification Search
USPC ............ 438/106; 257/692; 977/773
See application file for complete search history.

(56) References Cited

U.S. PATENT DOCUMENTS

| | | | |
|---|---|---|---|
| 3,214,827 A | 11/1965 | Phohofsky | |
| 3,766,439 A | 10/1973 | Isaacson | |
| 3,775,844 A | 12/1973 | Parks | |
| 3,873,889 A | 3/1975 | Leyba | |
| 4,225,900 A | 9/1980 | Ciccio et al. | |
| 4,567,543 A | 1/1986 | Miniet | |
| 4,576,543 A | 3/1986 | Kuchyt et al. | |
| 4,695,870 A | 9/1987 | Patraw | |
| 4,716,049 A | 12/1987 | Patraw | |
| 4,781,601 A | 11/1988 | Kuhl et al. | |
| 4,804,132 A | 2/1989 | DiFrancesco | |
| 4,902,600 A | 2/1990 | Tamagawa et al. | |
| 4,924,353 A | 5/1990 | Patraw | |
| 4,941,033 A | 7/1990 | Kishida | |
| 4,975,079 A | 12/1990 | Beaman et al. | |
| 4,982,265 A | 1/1991 | Watanabe et al. | |
| 4,991,290 A | 2/1991 | MacKay | |
| 5,046,238 A | 9/1991 | Daigle et al. | |
| 5,068,714 A | 11/1991 | Seipler | |

(Continued)

FOREIGN PATENT DOCUMENTS

| | | |
|---|---|---|
| EP | 0615283 A1 | 9/1994 |
| EP | 1091406 A2 | 4/2001 |

(Continued)

OTHER PUBLICATIONS

Choubey A; Hao Yu; Osterman M; Pecht M; Fu Yun; Li Yonghong; Xu Ming: "Intermetallics Characterization of lead-free solder joints under isothermal aging" Journal of Electronic Materials, vol. 37, No. 8, May 28, 2008, pp. 1130-1138, XP002555807.

(Continued)

*Primary Examiner* — A. Sefer
(74) *Attorney, Agent, or Firm* — Lerner, David, Littenberg, Krumholz & Mentlik, LLP

(57) ABSTRACT

A method of making an assembly includes the steps of applying metallic nanoparticles to exposed surfaces of conductive elements of either of or both of a first component and a second component, juxtaposing the conductive elements of the first component with the conductive elements of the second component with the metallic nanoparticles disposed therebetween, and elevating a temperature at least at interfaces of the juxtaposed conductive elements to a joining temperature at which the metallic nanoparticles cause metallurgical joints to form between the juxtaposed conductive elements. The conductive elements of either of or both of the first component and the second component can include substantially rigid posts having top surfaces projecting a height above the surface of the respective component and edge surfaces extending at substantial angles away from the top surfaces thereof.

19 Claims, 14 Drawing Sheets

(56) References Cited

U.S. PATENT DOCUMENTS

| | | |
|---|---|---|
| 5,083,697 A | 1/1992 | Difrancesco |
| 5,116,459 A | 5/1992 | Kordus et al. |
| 5,117,282 A | 5/1992 | Salatino |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,189,505 A | 2/1993 | Bartelink |
| 5,196,726 A | 3/1993 | Nishiguchi et al. |
| 5,198,888 A | 3/1993 | Sugano et al. |
| 5,214,308 A | 5/1993 | Nishiguchi et al. |
| 5,220,448 A | 6/1993 | Vogel et al. |
| 5,220,488 A | 6/1993 | Denes |
| 5,222,014 A | 6/1993 | Lin |
| 5,224,023 A | 6/1993 | Smith et al. |
| 5,247,423 A | 9/1993 | Lin et al. |
| 5,281,852 A | 1/1994 | Normington |
| 5,313,416 A | 5/1994 | Kimura |
| 5,324,892 A | 6/1994 | Granier et al. |
| 5,334,875 A | 8/1994 | Sugano et al. |
| 5,345,205 A | 9/1994 | Kornrumpf |
| 5,347,159 A | 9/1994 | Khandros et al. |
| 5,390,844 A | 2/1995 | Distefano et al. |
| 5,394,303 A | 2/1995 | Yamaji |
| 5,397,916 A | 3/1995 | Normington |
| 5,397,997 A | 3/1995 | Tuckerman et al. |
| 5,398,863 A | 3/1995 | Grube et al. |
| 5,409,865 A | 4/1995 | Karnezos |
| 5,422,435 A | 6/1995 | Takiar et al. |
| 5,426,563 A | 6/1995 | Moresco et al. |
| 5,440,171 A | 8/1995 | Miyano et al. |
| 5,448,511 A | 9/1995 | Paurus et al. |
| 5,454,160 A | 10/1995 | Nickel |
| 5,455,390 A | 10/1995 | DiStefano et al. |
| 5,455,740 A | 10/1995 | Burns |
| 5,479,318 A | 12/1995 | Burns |
| 5,489,749 A | 2/1996 | DiStefano |
| 5,491,302 A | 2/1996 | Distefano et al. |
| 5,518,964 A | 5/1996 | DiStefano et al. |
| 5,536,909 A | 7/1996 | DiStefano et al. |
| 5,552,963 A | 9/1996 | Burns |
| 5,587,342 A | 12/1996 | Lin et al. |
| 5,615,824 A | 4/1997 | Fjelstad et al. |
| 5,646,446 A | 7/1997 | Nicewarner, Jr. et al. |
| 5,656,550 A | 8/1997 | Tsuji et al. |
| 5,659,952 A | 8/1997 | Kovac et al. |
| 5,679,977 A | 10/1997 | Khandros et al. |
| 5,689,091 A | 11/1997 | Hamzehdoost et al. |
| 5,717,556 A | 2/1998 | Yanagida |
| 5,731,709 A | 3/1998 | Pastore et al. |
| 5,739,585 A | 4/1998 | Akram et al. |
| 5,762,845 A | 6/1998 | Crumly |
| 5,776,797 A | 7/1998 | Nicewarner, Jr. et al. |
| 5,777,386 A | 7/1998 | Higashi et al. |
| 5,789,815 A | 8/1998 | Tessier et al. |
| 5,798,286 A | 8/1998 | Faraci et al. |
| 5,802,699 A | 9/1998 | Fjelstad et al. |
| 5,805,422 A | 9/1998 | Otake et al. |
| 5,811,982 A | 9/1998 | Beaman et al. |
| 5,854,507 A | 12/1998 | Miremadi et al. |
| 5,861,666 A | 1/1999 | Bellaar |
| 5,956,234 A | 9/1999 | Mueller |
| 5,973,391 A | 10/1999 | Bischoff et al. |
| 5,980,270 A | 11/1999 | Fjelstad et al. |
| 5,985,692 A | 11/1999 | Poenisch et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,061,245 A | 5/2000 | Ingraham et al. |
| 6,157,075 A | 12/2000 | Karavakis et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,216,941 B1 | 4/2001 | Yokoyama et al. |
| 6,217,972 B1 | 4/2001 | Beroz et al. |
| 6,229,220 B1 | 5/2001 | Saitoh et al. |
| 6,235,996 B1 | 5/2001 | Farooq et al. |
| 6,258,625 B1 | 7/2001 | Brofman et al. |
| 6,300,679 B1 | 10/2001 | Mukerji et al. |
| 6,307,260 B1 | 10/2001 | Smith et al. |
| 6,322,903 B1 | 11/2001 | Siniaguine et al. |
| 6,329,594 B1 | 12/2001 | Sturcken |
| 6,332,270 B2 | 12/2001 | Beaman et al. |
| 6,335,571 B1 | 1/2002 | Capote et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,624,653 B1 | 9/2003 | Cram |
| 6,647,310 B1 | 11/2003 | Yi et al. |
| 6,648,213 B1 | 11/2003 | Patterson et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Iijima et al. |
| 6,815,252 B2 | 11/2004 | Pendse |
| 6,852,564 B2 | 2/2005 | Ohuchi et al. |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,888,255 B2 | 5/2005 | Murtuza et al. |
| 6,902,869 B2 | 6/2005 | Appelt et al. |
| 6,906,418 B2 | 6/2005 | Hiatt et al. |
| 6,956,165 B1 | 10/2005 | Hata et al. |
| 6,965,166 B2 | 11/2005 | Hikita et al. |
| 6,992,379 B2 | 1/2006 | Alcoe et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,115,495 B2 | 10/2006 | Wark et al. |
| 7,125,789 B2 | 10/2006 | Tellkamp et al. |
| 7,183,190 B2 | 2/2007 | Saijo et al. |
| 7,214,887 B2 | 5/2007 | Higashida et al. |
| 7,382,049 B2 | 6/2008 | Ho et al. |
| 7,569,935 B1 | 8/2009 | Fan |
| 7,598,613 B2 | 10/2009 | Tanida et al. |
| 7,745,943 B2 | 6/2010 | Haba et al. |
| 7,829,265 B2 | 11/2010 | Kitada et al. |
| 8,115,310 B2 | 2/2012 | Masumoto et al. |
| 2001/0008309 A1 | 7/2001 | Iijima et al. |
| 2002/0056906 A1 | 5/2002 | Kajiwara et al. |
| 2002/0074641 A1 | 6/2002 | Towle et al. |
| 2002/0090756 A1 | 7/2002 | Tago et al. |
| 2002/0125571 A1 | 9/2002 | Corisis et al. |
| 2002/0153602 A1 | 10/2002 | Tay et al. |
| 2002/0155661 A1 | 10/2002 | Massingill et al. |
| 2002/0185735 A1 | 12/2002 | Sakurai et al. |
| 2003/0001286 A1 | 1/2003 | Kajiwara et al. |
| 2003/0019568 A1 | 1/2003 | Liu et al. |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |
| 2003/0164540 A1 | 9/2003 | Lee et al. |
| 2003/0189260 A1 | 10/2003 | Tong et al. |
| 2003/0234453 A1 | 12/2003 | Liu et al. |
| 2004/0031972 A1 | 2/2004 | Pflughaupt et al. |
| 2004/0087057 A1* | 5/2004 | Wang et al. .................. 438/106 |
| 2004/0201096 A1 | 10/2004 | Iijima et al. |
| 2004/0245213 A1 | 12/2004 | Fukase et al. |
| 2005/0097727 A1 | 5/2005 | Iijima et al. |
| 2005/0101136 A1 | 5/2005 | Mori |

(56) References Cited

U.S. PATENT DOCUMENTS

| | | | |
|---|---|---|---|
| 2005/0116326 A1 | 6/2005 | Haba et al. | |
| 2005/0124091 A1 | 6/2005 | Fukase et al. | |
| 2005/0194695 A1* | 9/2005 | Lin et al. | 257/777 |
| 2005/0284658 A1 | 12/2005 | Kubota et al. | |
| 2005/0285246 A1 | 12/2005 | Haba et al. | |
| 2006/0220259 A1* | 10/2006 | Chen et al. | 257/778 |
| 2007/0017090 A1 | 1/2007 | Sakai et al. | |
| 2007/0045869 A1 | 3/2007 | Ho et al. | |
| 2007/0164447 A1 | 7/2007 | Ho et al. | |
| 2007/0230153 A1 | 10/2007 | Tanida et al. | |
| 2008/0003402 A1 | 1/2008 | Haba et al. | |
| 2009/0002964 A1 | 1/2009 | Haba | |
| 2009/0115047 A1* | 5/2009 | Haba et al. | 257/690 |
| 2009/0146303 A1 | 6/2009 | Kwon | |
| 2009/0188706 A1 | 7/2009 | Endo | |
| 2010/0044860 A1 | 2/2010 | Haba et al. | |

FOREIGN PATENT DOCUMENTS

| | | | |
|---|---|---|---|
| EP | 1602749 | | 12/2005 |
| JP | 62117346 A | | 5/1987 |
| JP | 62-68015 A | | 9/1994 |
| JP | 7-211722 | * | 8/1995 |
| JP | 7211722 A | | 8/1995 |
| JP | 11097576 A | | 4/1999 |
| JP | 2000277649 A | | 10/2000 |
| JP | 2001244365 A | | 9/2001 |
| JP | 2002124548 A | | 4/2002 |
| JP | 2002-313996 A | | 10/2002 |
| JP | 2003007768 A | | 1/2003 |
| JP | 2004221450 A | | 8/2004 |
| JP | 2005026645 A | | 1/2005 |
| JP | 2005032964 A | | 2/2005 |
| JP | 2005216696 A | | 8/2005 |
| JP | 2007023338 A | | 2/2007 |
| WO | 0141207 A1 | | 6/2001 |
| WO | 2006004672 A1 | | 1/2006 |
| WO | 2006057097 A1 | | 6/2006 |
| WO | 2009023283 A2 | | 2/2009 |

OTHER PUBLICATIONS

Co-Pending U.S. Appl. No. 11/166,982, Amendment dated Jun. 23, 2008.
Co-Pending U.S. Appl. No. 11/166,982, Non-final Rejection dated Mar. 21, 2008.
Co-Pending U.S. Appl. No. 11/717,587, US Final Office Action dated Mar. 16, 2011.
Co-Pending U.S. Appl. No. 11/717,587, Amendment dated Sep. 16, 2011.
Extended European Search Report for Application No. EP 08835829.6 dated Feb. 28, 2012.
International Search Report and Written Opinion, PCT/US2009/004694, mailed Dec. 7, 2009.
International Search Report, PCT/US2008/011271, dated Mar. 27, 2009.
International Search Report, PCT/US2008/03473 dated Sep. 15, 2008.
Korean Office Action for Application No. 10-2011-7006476 dated May 30, 2012.
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action from Japanese Application No. 2007-518347 dated Feb. 1, 2011.
Supplementary Partial European Search Report for Application No. EP 08835829 dated Feb. 21, 2012.
U.S. Appl. No. 12/965,172.
U.S. Appl. No. 12/965,192.
U.S. Appl. No. 60/508,970, filed Oct. 6, 2003.
U.S. Appl. No. 60/633,210, filed Dec. 30, 2003.
U.S. Appl. No. 60/533,393, filed Dec. 30, 2003.
Japanese Office Action for Application No. 2007-518347 dated Nov. 2, 2012.

* cited by examiner

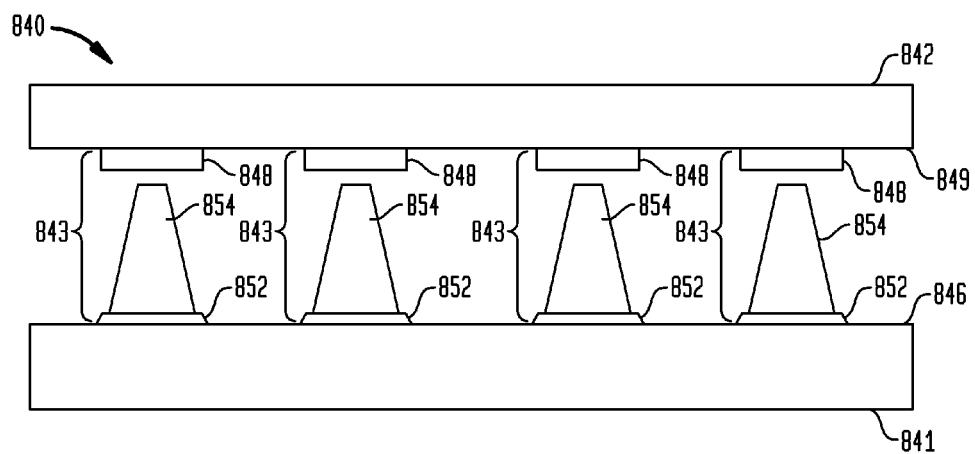
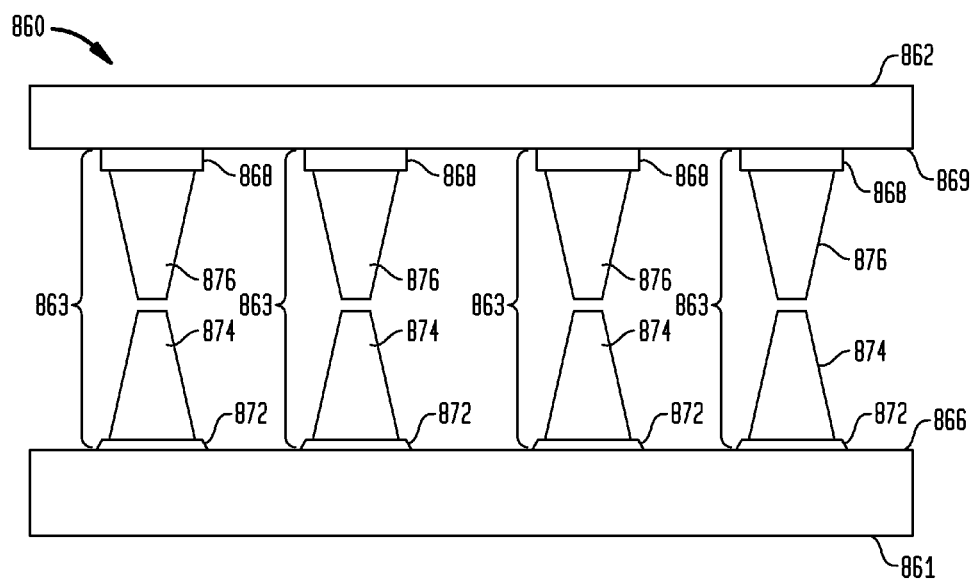

MICROELECTRONIC PACKAGES WITH NANOPARTICLE JOINING

BACKGROUND OF THE INVENTION

The present invention relates to microelectronic packages, to components for use in fabrication of microelectronic packages, and to methods of making the packages and components.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

In one face of the semiconductor chip is fabricated the active circuitry. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as gold or aluminum, around 0.5 µm thick. The size of the bond pads will vary with the device type but will typically measure tens to hundreds of microns on a side.

Flip-chip interconnection is a commonly used scheme for conductively connecting bond pads on the semiconductor chip to contact pads on a substrate. In flip-chip interconnection, lumps of metal are typically placed on each bond pad. The die is then inverted so the metal lumps provide both the electrical pathway between the bond pads and the substrate as well as the mechanical attachment of the die to the substrate.

There are many variations of the flip-chip process, but one common configuration is to use solder for the lumps of metal and fusion of the solder as the method of fastening it to the bond pads and the substrate. When it melts, the solder flows to form truncated spheres.

It is becoming more difficult to package semiconductor chips in a flip-chip manner in which the contacts of the chip face toward corresponding contacts of a package substrate. Increased density of the chip contacts is causing the pitch between contacts to be reduced. Consequently, the volume of solder available for joining each chip contact to the corresponding package contact is reduced. Moreover, smaller solder joints cause the stand-off height between the contact-bearing chip surface and the adjacent face of the package substrate to be reduced. However, when the contact density is very high, the stand-off height may need to be greater than the height of a simple solder joint in order to form a proper underfill between the adjacent surfaces of the chip and package substrate. In addition, it may be necessary to require a minimum stand-off height in order to allow the contacts of the package substrate to move somewhat relative to the contacts of the chip in order to compensate for differential thermal expansion between the chip and the substrate.

One approach that has been proposed to address these concerns involves forming metal columns by electroplating a metal such as copper directly on the chip contacts, using a photoresist mask overlying the chip front surface to define the locations and height of the columns. The chip with the columns extending from the bond pads thereon can then be joined to corresponding contacts of the package substrate. Alternatively, a similar approach can be taken to form metal columns on exposed pads of the substrate. The substrate with the columns extending from the contacts thereon can then be joined to corresponding contacts of the chip.

However, the process of forming the columns by electroplating can be problematic when performed simultaneously over a large area, such as, for example, the entire area of a wafer (having a diameter from about 200 millimeters to about 300 millimeters) or over the entire area of a substrate panel (typically having dimensions of about 500 millimeters square). It is difficult to achieve metal columns with uniform height, size and shape. All of these are very difficult to achieve when the size and height of the columns is very small, e.g., at column diameters of about 75 microns or less and column heights of about 50 microns or less. Variations in the thickness of the photoresist mask and the size of shape of patterns over a large area such as a wafer or substrate panel can interfere with obtaining columns of uniform height, size and shape.

In another method, bumps of solder paste or other metal-filled paste can be stenciled onto conductive pads on an exposed surface of a substrate panel. The bumps can then be flattened by subsequent coining to improve planarity. However, tight process control can be required to form bumps having uniform solder volume, especially when the pitch is very small, e.g., about 200 microns or less. It can also be very difficult to eliminate the possibility of solder-bridging between bumps when the pitch is very small, e.g., about 200 microns or less.

Despite the advances that have been made in flip chip interconnections, there is still a need for improvements in order to minimize the package thickness, while enhancing joint reliability. These attributes of the present invention are achieved by the construction of the microelectronic packages as described hereinafter.

SUMMARY OF THE INVENTION

In accordance with an aspect of the invention, a method of making an assembly includes the step of applying metallic nanoparticles to exposed surfaces of conductive elements of either of or both of a first component and a second component. The method can also include the step of juxtaposing the conductive elements of the first component with the conductive elements of the second component with the metallic nanoparticles disposed therebetween. The method can also include the step of elevating a temperature at least at interfaces of the juxtaposed conductive elements to a joining temperature at which the metallic nanoparticles cause metallurgical joints to form between the juxtaposed conductive elements. Each component can be any of a microelectronic element having active semiconductor devices therein, a dielectric element, a semiconductor element, or a microelectronic assembly including a microelectronic element and a substrate attached thereto.

In one embodiment, the conductive elements of either of or both of the first component and the second component can include substantially rigid posts having top surfaces projecting a height above the surface of the respective component and edge surfaces extending at substantial angles away from the top surfaces thereof.

In a particular embodiment, the step of applying the metallic nanoparticles can be performed by applying the nanoparticles selectively to the exposed surfaces of the conductive elements of at least one of the first or second components. In one embodiment, the metal nanoparticles can consist essentially of at least one selected from the group consisting of gold, tin, and copper. In a particular embodiment, the joining temperature can be above room temperature but substantially below 200° C. In one embodiment, at least one of the first or second components can be a microelectronic element including active semiconductor devices. The joining temperature can be not more than 150° C.

In an exemplary embodiment, the first component can be a microelectronic element including active semiconductor devices. In a particular embodiment, the second component can be a microelectronic element including active semiconductor devices. In one embodiment, the second component can be a semiconductor substrate. In an exemplary embodiment, the second component can be a dielectric substrate. In one embodiment, at least prior to the elevating a temperature step, the metallic nanoparticles can overlie edge surfaces of the posts.

In one embodiment, the method can also include, prior to the applying metallic nanoparticles step, applying a no flow underfill dielectric region between the posts. In a particular embodiment, the method can also include, prior to the applying metallic nanoparticles step, planarizing the underfill dielectric region with the top surfaces of the posts. In an exemplary embodiment, the method can also include, prior to the applying metallic nanoparticles step, etching the top surfaces of the posts such that the top surfaces become recessed below a plane defined by a surface of the underfill dielectric region.

In a particular embodiment, the conductive elements of both of the first component and the second component can include substantially rigid posts having top surfaces projecting a height above the surface of the respective component. The step of juxtaposing the conductive elements of the first component with the conductive elements of the second component can be performed with the metallic nanoparticles at least disposed between the top surfaces of the posts of the first and second components.

In one embodiment, the method can also include, prior to the applying metallic nanoparticles step, forming a first no flow underfill dielectric region between the posts of the first component and forming a second no flow underfill dielectric region between the posts of the second component. In an exemplary embodiment, the elevating a temperature step can include joining the first and second underfill dielectric regions. In one embodiment, the method can also include, prior to the applying metallic nanoparticles step, planarizing a surface of the first underfill dielectric region with the top surfaces of the posts of the first component, and planarizing a surface of the second underfill dielectric region with the top surfaces of the posts of the second component.

In a particular embodiment, the method can also include, prior to the applying metallic nanoparticles step, etching the top surfaces of the posts of either or both of the first component and the second component, such that the top surface of each etched post becomes recessed below a plane defined by a surface of the respective underfill dielectric region. In an exemplary embodiment, the method can also include, after the elevating a temperature step, forming an underfill dielectric region between juxtaposed surfaces of the first and second components.

In accordance with an aspect of the invention, a method of fabricating an assembly includes the step of juxtaposing a member including at least one metal layer with a plurality of exposed conductive elements of a component, with metallic nanoparticles therebetween. The method can also include the step of elevating a temperature at least at interfaces of the conductive elements with the metal layer to a joining temperature at which the metallic nanoparticles cause metallurgical joints to form between the conductive elements and the metal foil. The method can also include the step of subtractively patterning the metal layer to form a plurality of conductive posts projecting away from the conductive pads. The component can be any of a microelectronic element including active semiconductor devices, a dielectric element, a semiconductor element, or a microelectronic assembly that includes a microelectronic element and a substrate attached thereto.

In a particular embodiment, the metal nanoparticles can consist essentially of at least one selected from the group consisting of gold, tin, and copper. In one embodiment, the joining temperature can be above room temperature but substantially below 200° C. In an exemplary embodiment, the joining temperature can be not more than 150° C. In a particular embodiment, the component can include a dielectric element and the conductive pads can be exposed at a surface of the dielectric element, such that the step of subtractively patterning the metal foil forms the conductive posts extending from the conductive pads of the dielectric element. In one embodiment, the component can be a microelectronic element including active semiconductor devices and the conductive pads can be exposed at a surface of the microelectronic element, such that the step of subtractively patterning the metal foil forms the conductive posts extending from the conductive pads of the microelectronic element.

In accordance with an aspect of the invention, an assembly includes a first component having a front surface and a plurality of first conductive elements exposed at the front surface. The assembly can also include a second component having a major surface and a plurality of second conductive elements exposed at the major surface. The first conductive elements can be joined with the second conductive elements. Each first conductive element can be electrically interconnected to a second conductive element by a bond region including impurities that show structural evidence of the use of metal nanoparticles in the joining process. Each bond region can penetrate at least partially into the first conductive element and the second conductive element. The first and second components can be any of a microelectronic element including active semiconductor devices, a dielectric element, a semiconductor element, or a microelectronic package that includes a microelectronic element and a substrate attached thereto.

In one embodiment, either of or both of the first conductive elements and the second conductive elements can include substantially rigid posts having top surfaces projecting a height above the surface of the respective component, such that the top surfaces of the posts are remote from the surface of the respective component, and the posts can have edge surfaces extending at substantial angles away from the top surfaces thereof.

In an exemplary embodiment, the metal nanoparticles can consist essentially of at least one selected from the group consisting of gold, tin, and copper. In an exemplary embodiment, the first component can be a microelectronic element including active semiconductor devices. In a particular embodiment, the second component can be a microelectronic element including active semiconductor devices. In one embodiment, the second component can be a semiconductor substrate. In an exemplary embodiment, the second component can be a dielectric substrate.

In a particular embodiment, the first component can be a microelectronic element wafer including a plurality of microelectronic element portions. Each microelectronic element portion can include a respective subset of the first conductive elements exposed at the front surface. The second component can be at least a portion of a substrate panel including a plurality of substrate portions. Each substrate portion can include a respective subset of the second conductive elements exposed at the major surface. In an exemplary embodiment, the nanoparticles can contact edge surfaces of the posts.

In one embodiment, at least one post can have a base, a tip remote from the base at a height from the base, and a waist between the base and the tip. The tip can have a first diameter, and the waist can have a second diameter. A difference between the first and second diameters can be greater than 25% of the height of the post. In a particular embodiment, both of the first conductive elements and the second conductive elements can include substantially rigid posts having top surfaces projecting a height above the surface of the respective component. The posts of the first component can be joined with the posts of the second component. In an exemplary embodiment, the assembly can also include an underfill dielectric region disposed between the surfaces of the first and second components and surrounding the posts of the first and second components. In one embodiment, the underfill dielectric region can include a no flow underfill dielectric material.

In accordance with an aspect of the invention, an assembly includes a component having a surface and a plurality of conductive elements thereon. The component can be any of a microelectronic element including active semiconductor devices, a dielectric element, a semiconductor element, or a microelectronic package that includes a microelectronic element and a substrate attached thereto. The assembly can also include a plurality of substantially rigid conductive posts overlying and projecting away from respective ones of the conductive elements. Each conductive post can be electrically interconnected to a respective conductive element by a bond layer including impurities that show structural evidence of the use of metal nanoparticles in the joining process. The bond layer can penetrate at least partially into both the substantially rigid conductive posts and the conductive elements.

In one embodiment, the metal nanoparticles can consist essentially of at least one selected from the group consisting of gold, tin, and copper. In a particular embodiment, the conductive posts can have top surfaces and edge surfaces extending at substantial angles away therefrom. The nanoparticles can be disposed between the top surfaces of the conductive posts and the conductive elements and the nanoparticles can contact the edge surfaces of the conductive posts. In an exemplary embodiment, at least one post can have a base, a tip remote from the base at a height from the base, and a waist between the base and the tip. The tip can have a first diameter, and the waist can have a second diameter, wherein a difference between the first and second diameters is greater than 25% of the height of the post.

In a particular embodiment, the posts can extend in a vertical direction above the bond region and at least one post can include a first etched portion having a first edge. The first edge can have a first radius of curvature. At least one post can include at least one second etched portion between the first etched portion and the bond region. The second etched portion can have a second edge having a second radius of curvature different from the first radius of curvature. In an exemplary embodiment, the component can include a dielectric element and the conductive elements can be exposed at a surface of the dielectric element. In one embodiment, the component can be a microelectronic element including active semiconductor devices therein.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 24 is a sectional view illustrating a completed microelectronic assembly in accordance with another embodiment.

FIG. 25 is a sectional view illustrating a completed microelectronic assembly in accordance with another embodiment.

DETAILED DESCRIPTION

Figure 1:
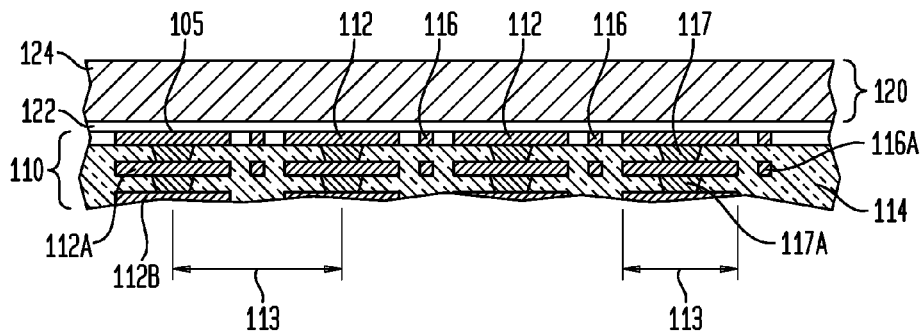
FIG. 1 is a fragmentary sectional view illustrating a stage in a method of fabricating a substrate having protruding conductive posts in accordance with one embodiment.

FIG. 1 is a fragmentary sectional view illustrating a stage in a method of fabricating a substrate having a copper bump interface in accordance with one embodiment herein. As seen in FIG. 1, an interconnection substrate 110, which can be fully or partially formed, is joined with a layered metal structure 120 such that a bond region 122 of the layered metal structure contacts conductive pads 112 exposed at a major surface of a dielectric element or substrate 114. In one particular embodiment, the substrate can include a dielectric element bearing a plurality of conductive elements. In one example, the conductive pads can consist essentially of copper. The conductive elements can include contacts, traces, or both contacts and traces. The contacts can be provided as conductive pads having larger diameters than widths of the traces. Alternatively, the conductive pads can be integral with the traces and can be of approximately the same diameter or only somewhat larger than widths of the traces. Without limitation, one particular example of a substrate can be a sheet-like flexible dielectric element, typically made of a polymer, e.g., polyimide, among others, having metal traces and contacts patterned thereon, the contacts being exposed at at least one face of the dielectric element. As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

In one embodiment, the dielectric element may have a thickness of 200 micrometers or less. In a particular example, the conductive pads can be very small and can be disposed at a fine pitch. For example, the conductive pads may have dimensions 113 in a lateral direction of 75 microns or less and can be disposed at a pitch of 200 microns or less. In another example, the conductive pads may have dimensions in a lateral direction of 50 microns or less and can be disposed at a pitch of 150 microns or less. In another example, the conductive pads may have dimensions in a lateral direction of 35 microns or less and can be disposed at a pitch of 100 microns or less. These examples are illustrative; conductive pads and their pitch can be larger or smaller than those indicated in the examples. As further seen in FIG. 1, conductive traces 116 may be disposed at the major surface of the dielectric element 114.

For ease of reference, directions are stated in this disclosure with reference to a "top" surface 105 of a substrate 114, i.e., the surface at which conductive pads 112 are exposed. Generally, directions referred to as "upward" or "rising from" shall refer to the direction orthogonal and away from the top surface 128. Directions referred to as "downward" shall refer to the directions orthogonal to the chip top surface 128 and opposite the upward direction. A "vertical" direction shall refer to a direction orthogonal to the chip top surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Figure 2:
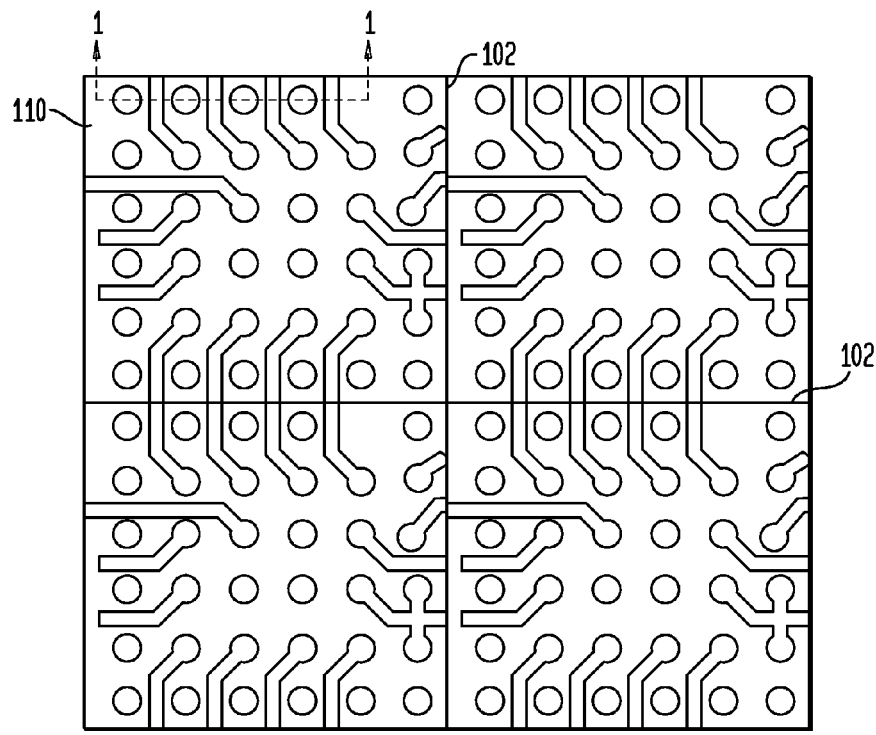
FIG. 2 is a plan view corresponding to FIG. 1 of a partially fabricated substrate depicted in FIG. 1, the section taken through line 1-1 of FIG. 2.

The interconnection substrate can further include one or more additional conductive layers within the dielectric element 114 which have additional conductive pads 112A, 112B and vias 117, 117A for interconnection between the conductive pads 112, 112A, 112B of different layers. The additional conductive layers can include additional traces 116A. As best seen in FIG. 2, the interconnection substrate 110 (shown in panel form) has conductive pads 112 and conductive traces 116 exposed at the top surface 105 of a dielectric element.

As illustrated in FIG. 2, the traces 116 can be disposed between the conductive pads 112 or can be disposed in other locations. The particular pad and trace pattern is merely illustrative of many possible alternative configurations. As illustrated in FIG. 2, some or all of the traces can be directly connected to conductive pads 112 at the major surface. Alternatively, some or all of the conductive traces 116 may not have any connections with the conductive pads 112. As depicted in FIG. 2, the interconnection substrate can be one of many such interconnection substrates attached at peripheral edges 102 of the substrates within a larger unit such as a panel or strip during processing. In one embodiment, the dimensions of the panel can be 500 millimeters square, i.e., the panel can have a dimension of 500 millimeters along an edge of the panel in a first direction and have a dimension of 500 millimeters along another edge of the panel in a second direction transverse to the first direction. In one example, when completed, such panel or strip may be divided into a number of individual interconnection substrates. The so-formed interconnection substrates may be suitable for flip-chip interconnection with a microelectronic element such as a semiconductor chip.

Referring again to FIG. 1, the layered metal structure 120 includes a patternable metal layer 124 and a bond region 122 that can include an intermetallic region or joining region that includes a metal of the patternable metal layer 124, a metal of the conductive pads 112, or both, and a metal used to assist in a joining process between the pads and the patternable metal layer. These metals can be the same or different. In a particular example, the joining region consists essentially of copper when each of the patternable metal layer 124, the conductive pads 112, and the bond region 122 consists essentially of copper. In another example, when a metal used to assist in the joining process is a different metal, for example, tin or gold, such different metal can form a bond region including an intermetallic with the metal of the conductive pads 112 and the metal layer 124. In one example, the patternable metal layer 124 can include a foil consisting essentially of a metal such as copper. The foil typically has a thickness less than 100 microns. In a particular example, the thickness of the foil can be a few tens of microns. In another example, the thickness of the foil can be more than 100 microns.

In particular examples, the bond region 122 can include tin, or alternatively indium, or a combination of tin and indium. In one embodiment, the bond region can include one or more metals which has a low melting point ("LMP") or low melting temperature which is sufficiently low, such that an electrically conductive connection has been established by melting and fusing to metal elements with which it contacts.

For example, an LMP metal generally refers to any metal having a low melting point which allows it to melt at sufficiently low temperatures that are acceptable in view of the property of an object to be joined. Although the term "LMP metal" is sometimes used to generally refer to metals having a melting point (solidifying point) that is lower than the melting point of tin (about 232° C.=505 K), the LMP metal of the present embodiment is not always restricted to metals having a melting point lower than that of tin, but includes any simple metals and metal alloys that can appropriately bind to the material of the bump appropriately and that have a melting point temperature that parts for which an interconnection element is used for connection can tolerate. For example, for an interconnection element provided on a substrate using a dielectric element which has low heat resistance the melting point of the metal or metal alloy used according to the presently disclosed embodiments should be lower than the allowable temperature limit of the dielectric element 114.

In one embodiment, the bond region 122 can include a tin metal such as tin or an alloy of tin, such as tin-copper, tin-lead, tin-zinc, tin-bismuth, tin-indium, tin-silver-copper, tin-zinc-bismuth and tin-silver-indium-bismuth, for example. These metals have a low melting point and an excellent connectivity with respect to a metal foil made of copper and posts which can be formed therefrom by etching the metal foil. Furthermore, if the conductive pad 112 includes or consists of copper, the bond region 122 has excellent connectivity with respect to the conductive pad 112. The composition of such bond region 122 does not always need to be uniform. For example, the bond region may be a single layer or multilayered.

During such process, material from the bond region 122 can diffuse outwardly into the conductive pads 112 or the metal foil or both. Conversely, material from the conductive pads 112, the metal foil, or both can diffuse therefrom into the bond region 122. In such manner, the resulting structure can include an "intermetallic" joining layer 121 that joins the metal foil with the conductive pads, such intermetallic joining layer which can include a solid solution of a material from the bond region 122 with the material of the foil 124, the conductive pad 112 or both.

Figure 1A:
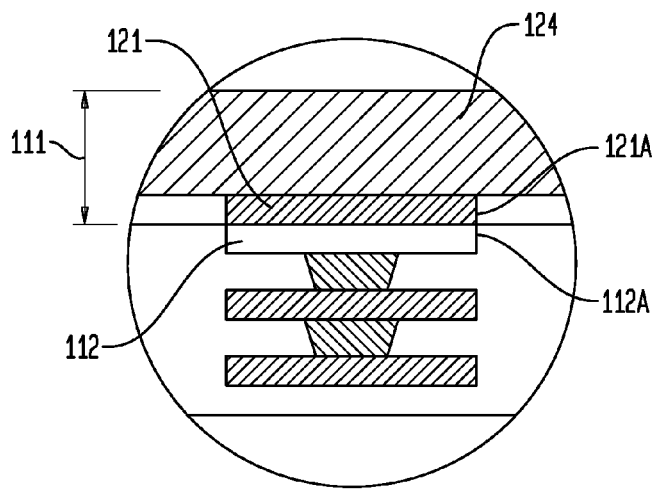
FIG. 1A is a partial fragmentary sectional view further illustrating interconnection between a metal foil and a conductive pad of a substrate.

Because of diffusion between the bond region 122 and the conductive pads 112, the resulting intermetallic layer can be aligned with portions of the conductive pads contacted by the bond region. In one embodiment, as seen in FIG. 1A, an edge 121A of the intermetallic layer 121 can be at least roughly aligned in a vertical direction 111 with an edge 112A of the conductive pad 112. Within the intermetallic layer, the composition ratio of the intermetallic layer may change gradually at one or both of an interface thereof with the conductive pad 112 or an interface with the foil 124 or post 130 (FIG. 4) that is subsequently patterned therefrom. Alternatively, the compositions of the bond region 122, conductive pad 112, and post 130 can undergo metallurgical segregation or aggregation at their interfaces or between the interfaces, such that the composition of one or more of the conductive pad, post, or bond region can change with the depth from the interface between such elements. This can occur even though the bond region 122, conductive pad 112, or metal foil 124 can have a single composition when it is created.

When the bond region 122 includes an intermetallic layer, the intermetallic layer can have such composition that the layer can have a melting temperature which is higher than a temperature at which a joining process can be performed to join the posts 130 of the interconnection element with contacts of an external component, e.g., another substrate, microelectronic element, passive device, or active device. In such way, the joining process can be performed without causing the intermetallic layer to melt, thus maintaining positional stability of the posts relative to conductive elements, e.g., pads or traces of the substrate from which the posts project in a direction away from the surface of the substrate.

In one embodiment, the intermetallic layer can have a melting temperature below a melting temperature of a metal, e.g., copper, of which the conductive pads 112 essentially consist. Alternatively or in addition thereto, in one embodiment, the intermetallic layer can have a melting temperature below a melting temperature of a metal, e.g., copper, of which the foil 124 and the posts 130 are subsequently formed therefrom.

In one embodiment, the intermetallic layer can have a melting temperature which is higher than a melting temperature of the bond region 122 as originally provided, that is, a melting temperature of the bond region as it exists before the substrate with the bond region and metal foil thereon are heated to form the intermetallic layer.

As mentioned above, the bond region 122 need not include tin. For example, the bond region 122 can include a different metal such as indium or an alloy thereof. The above description regarding the formation and composition of an intermetallic layer can also apply when using such other type of metal such that diffusion can occur between such metal and one or more of the foil and the conductive pads to form the intermetallic layer.

The bond region 122 typically has a thickness ranging from less than one micron up to a few microns. A relatively thin diffusion barrier layer (not shown) can be provided at an interface of the bond region and the foil. In one example, the diffusion barrier layer can include a metal such as nickel. The diffusion barrier layer can help limit diffusion of a joining metal present in the bond region into the foil, such as, for example, when the foil consists essentially of copper and the bond region includes tin or indium.

In another example, the bond region 122 can include a conductive paste such as a solder paste or other metal-filled paste or paste containing a conductive compound of a metal or combination thereof. For example, a uniform layer of solder paste can be spread over the surface of the foil. Particular types of solder paste can be used to join metal layers at relatively low temperatures. For example, indium- or silverbased solder pastes which include "nanoparticles" of metal, i.e., particles having long dimensions typically smaller than about 100 nanometers, can have sintering temperatures of about 150° C. The actual dimensions of the nanoparticles can be significantly smaller, e.g., having dimensions from about one nanometer and larger.

As used herein, the term "nanoparticles" includes nanomaterials in any form, including, for example, clusters of nanoparticles having long dimensions typically smaller than about 100 nanometers, nanoparticles suspended in a liquid, or nanoparticles suspended in a paste containing a surfactant.

In another example, the bond region 122 can include a film of nanoparticles consisting essentially of at least one of gold, tin, copper, another metal, or a combination of metals. For example, a uniform layer of gold nanoparticles can be spread over the surface of the patternable metal layer 124, such that the nanoparticles can bond the exposed conductive pads 112 to the metal included in the foil 124. A paste containing the nanoparticles can be spread over the surface of the patternable metal layer 124 to form a continuous layer, or a paste containing the nanoparticles can be deposited in discrete locations to form a substantially discontinuous layer.

Nanoparticles can experience melting point depression, in which nanoscale materials can melt at temperatures substantially lower than bulk materials. In one example, the melting point of nanoparticles can be hundreds of degrees ° C. lower than that of a bulk region of the same material of which the nanoparticles consist. The melting point depression of metal nanoparticles is most pronounced when the metal has a particle diameter below about 50 nm. Having a bond region 122 that consists essentially of nanoparticles can allow the bond region 122 to have a melting point at room temperature or within a few hundred ° C. above room temperature, thereby improving the alignment of the posts 130 relative to the conductive pads 112 in lateral directions 113, 115 (FIG. 3) because there can be less differential thermal expansion between the substrate 114 and the metal layer 124 when the posts 130 can be joined to the conductive pads 112 near room temperature.

In a particular embodiment, the bond region 122 can comprise nanoparticles (e.g., gold nanoparticles) that are applied directly to the upper surface of the conductive pads 112 rather than being spread over the surface of the patternable metal layer 124. In such an embodiment, the nanoparticles that comprise the bond region 122 can be selectively stencil printed, screen printed, dispensed, sprayed, dabbed, or brushed onto the conductive pads 112 by an apparatus.

Figure 27:
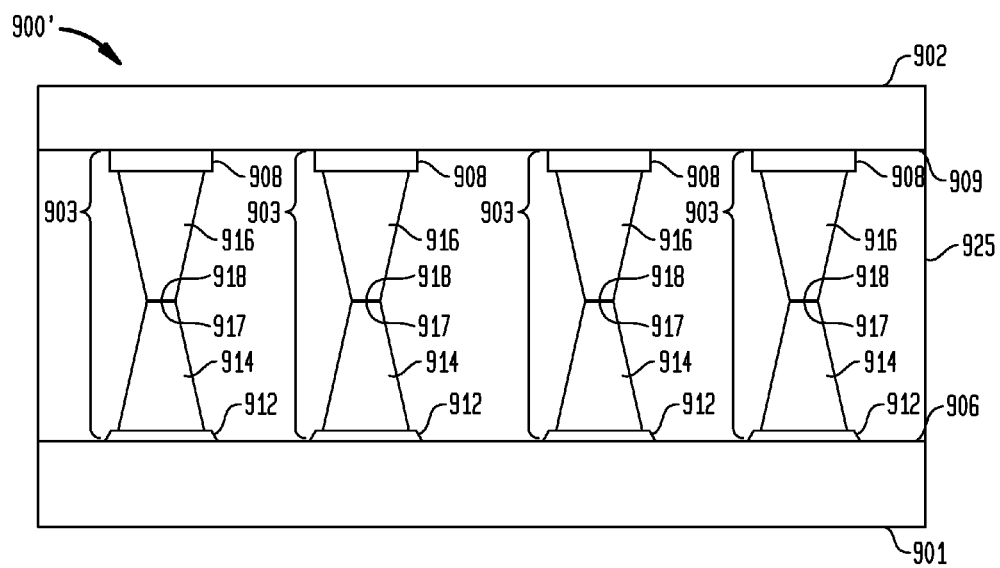
FIG. 27 is a sectional view illustrating the microelectronic assembly depicted in FIG. 26 with the opposing posts joined together at the tips thereof.

After two conductive elements (e.g., the metal layer 124 and the conductive pads 112 shown in FIG. 1, or the conductive posts 914 and 916 shown in FIG. 27) are joined together by nanoparticles or nanomaterials in any form, the bond region (e.g., the bond region 122 shown in FIG. 1 or a bond region created at the tips 917 and 918 of the respective posts 914 and 916) that joins the two conductive elements together can show structural evidence that nanoparticles were used to join the conductive elements.

For example, during joining of two conductive elements, the nanoparticles that are suspended in a nanoparticle paste can diffuse into the conductive elements that are joined. After joining, the metal formerly comprising the nanoparticles are no longer in the form of clusters of nanoparticles having long dimensions typically smaller than about 100 nanometers. However, a nanoparticle paste will include contaminants that are also suspended in the surfactant. The type of contaminants and the concentration of the contaminants that are present in the bond region of the joined metallic structure can be unique to the use of a nanoparticle paste or any other nanomaterials to join the conductive elements. If a cross-section is taken of the joined metallic structure, such structural evidence of the use of nanoparticles can be evident to one skilled in the art.

In one embodiment, in a process of stencil printing, a stencil mask having a plurality of apertures each large enough to expose the upper surface of a conductive pad 112 is aligned with the interconnection substrate 110. A stencil mask, preferably including a laser-formed, stainless steel material, can be used. The distance between the stencil and the upper surface of each pad is preferably between about 5 and 15 mils. A squeegee blade then passes over the stencil mask at a uniform velocity while distributing the nanoparticles in the form of a paste. The stencil mask is then removed, leaving deposits of nanoparticles on the upper surfaces of the conductive pads 112. The thickness of the nanoparticles paste deposited into the upper surfaces of the conductive pads 112 is affected by the downward force exerted by the squeegee blade as the squeegee blade passes over the stencil mask. For instance, the deposited nanoparticle paste becomes thinner as the downward force exerted by the squeegee blade is increased.

In another embodiment, the nanoparticles can be applied to the interconnection substrate 110 through a process of screen printing. In this process, a printing mesh, typically including strands of stainless steel or a similar material, is placed over upper surfaces of the conductive pads 112. A squeegee blade then passes over the printing mesh at a uniform velocity while distributing the nanoparticles in the form of a paste. The strands of the mesh provide a plurality of small apertures, through which the nanoparticle paste is forced onto the upper surfaces of the conductive pads 112 by the squeegee to form deposits of nanoparticles thereon.

In yet another embodiment, the nanoparticles can be applied to the interconnection substrate 110 by a dispensing process. In this process, a nanoparticle paste is stored in a cartridge and is dispensed onto the upper surfaces of the conductive pads 112 through a nozzle. The nanoparticles paste may be forced through the nozzle by means of a pump or other mechanical device. The flow rate of the nanoparticles paste through the nozzle can be minimized as to assure an even distribution. Therefore, the opening of the nozzle should be small enough to assure a low flow rate and even distribution.

More details concerning the processes of stencil printing, screen printing, and dispensing applied to microelectronic packages are disclosed in U.S. Patent Application Publication No. 2007/0246820.

In a particular embodiment, the nanoparticles can be propelled through a nozzle by an aerosol onto the upper surfaces of the conductive pads 112. The operation of the sprayer and location of the nozzle in lateral directions 113, 115 relative to the substrate 110 can be controlled, for example, by one or more stepper motors, similar to that of an electronically controlled printing apparatus, e.g., an inkjet printer, or an electronically controlled wirebonder apparatus.

In one embodiment, more than one bond region may be used to join the metal foil with the conductive pads of the substrate. For example, a first bond region can be provided on the foil and a second bond region can be provided on the conductive pads of the substrate. Then, the foil having the first bond region thereon can be juxtaposed with the conductive elements having the second bond region thereon and heat can be applied (or the foil and pads can be allowed to become warmer) to the first and second bond regions to form electrically conductive joints between the conductive pads and the foil. The first and second bond regions can have the same or different compositions. In one embodiment, one of the first and second bond regions can include tin and/or gold nanoparticles and the other of the first and second bond regions can include silver and/or indium nanoparticles.

Figure 3:
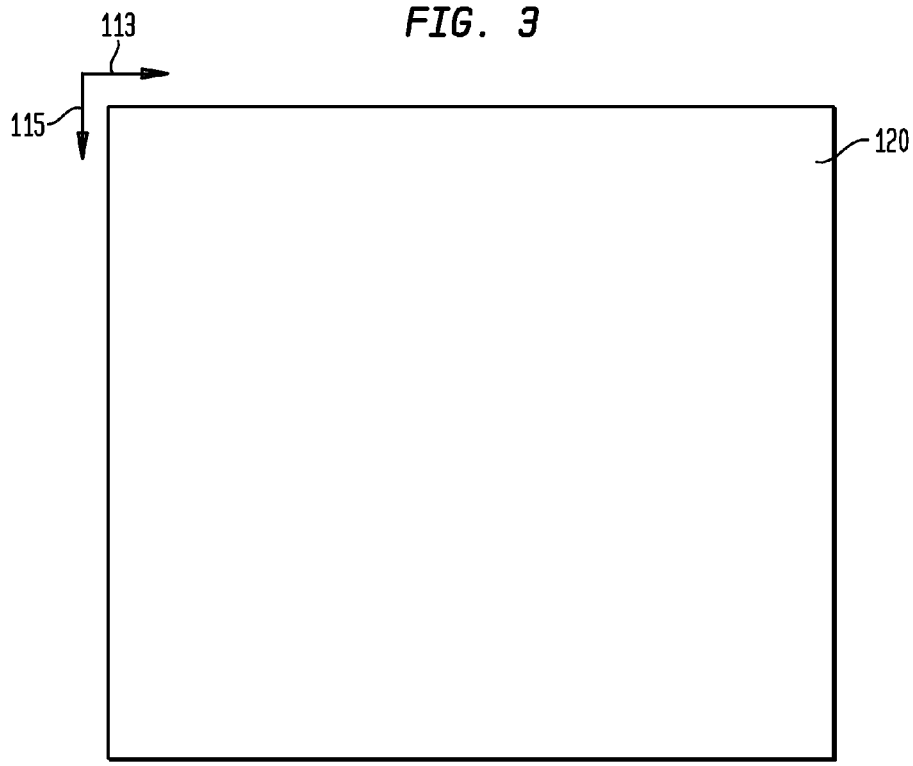
FIG. 3 is a plan view corresponding to FIG. 1 of a layered metal structure depicted in FIG. 1.

As best seen in FIG. 3, the foil can be continuous in lateral directions 113, 115 over at least the dimensions of the partially formed interconnection substrate, the foil being covered with a bond region which is continuous over the same dimensions. In one example, the layered metal structure can be of the same dimensions as a substrate panel, e.g., 500 millimeters square.

Figure 1B:
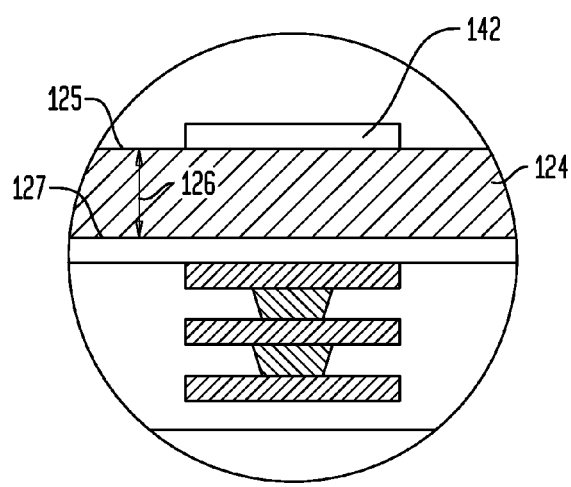
FIG. 1B is a partial fragmentary sectional view further illustrating a stage in formation of an interconnection element in accordance with one embodiment.

As depicted in FIG. 1, the bond region 122 is joined to the conductive pads 112 of the partially fabricated substrate. Then, the metal foil 124 is patterned subtractively by photolithography to form conductive or metal posts. For example, a photoresist or other mask layer can be patterned by photolithography to form an etching mask 142 overlying a top surface 125 of the metal foil, as seen in FIG. 1B. The metal foil 124 can then be selectively etched from the top surface in locations not covered by the etching mask, to form solid metal posts or substantially rigid conductive posts 130 (FIG. 4).

Figure 4:
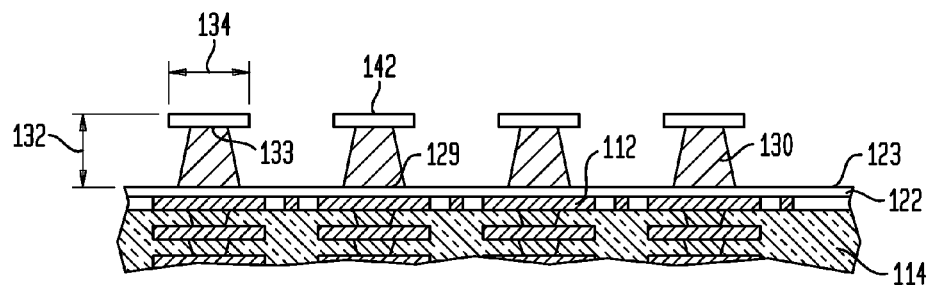
FIG. 4 is a fragmentary sectional view illustrating a stage in a method of fabricating a substrate subsequent to the stage illustrated in FIGS. 1-3.

Referring now to FIG. 4, when viewed from above an exposed surface 123 of the bond region 122, the base 129 of each post can have a circular area in contact with the bond region which can be larger than the tip (apex) 133 of the post. The tip, which is disposed at a height 132 above the surface 123 of the bond region can have a smaller area than the base. Typically, the tip also has circular area when viewed from above the bond region surface 123. The shape of the post is rather arbitrary and may be not only a frustum or truncated cone (a part of a cone whose top portion is cut off along a face parallel to its bottom face) shown in the drawings, but also of a cylinder or a cone or any other similar shape known in the art, such as a cone with round top or a plateau shape. Furthermore, in addition to or rather than the three dimensional (3D) shape having a circular cross-section, which is called a "solid of revolution", such as the truncated cone, the post 130 may have an arbitrary shape such as any three dimensional shape having a polygonal horizontal cross-section. Typically, the shape can be adjusted by changing the resist pattern, etching conditions or the thickness of the original layer or metal foil from which the post is formed. Although the dimensions of the post 130 are also arbitrary and are not limited to any particular ranges, often, it may be formed to project from an exposed surface of the substrate 110 by 10 to 500 micrometers, and if the post has the circular cross-section, the diameter may be set in a range of a few tens of microns and greater. In a particular embodiment the diameter of the post can range between 0.1 mm and 10 mm. In a particular embodiment, the material of the post 130 can be copper or copper alloy. The copper alloy can include an alloy of copper with any other metal or metals.

Typically, the posts are formed by etching the metal foil isotropically, with the mask 142 (FIG. 1B) disposed on or above the metal foil such that etching proceeds from the top surface 125 of the metal foil in a direction of a thickness 126 (FIG. 4A) of the metal foil, i.e., towards a bottom surface 127 of the metal foil. Simultaneously, etching proceeds in lateral directions 113, 115 (FIG. 3) in which the top surface of the metal foil extends. Etching can proceed until a surface 123 of the bond region 122 is fully exposed between posts such that the height 126' of each post from the exposed surface 123 of the bond region can be the same as the thickness 126 of the metal foil 124 (FIG. 1B).

Figure 4A:
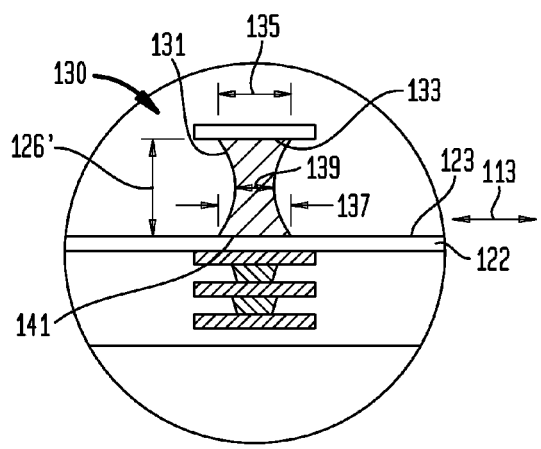
FIG. 4A is a partial fragmentary sectional view further illustrating structure of a conductive post formed in accordance with an embodiment.

Posts 130 formed in such manner can have a shape as seen in FIG. 4A, in which the edge 131 of the post may curve continuously from the tip 133 to the base 141 of the post in contact with the underlying bond region 122 or intermetallic layer formed therefrom. In one example, the edge 131 of the post may be curved over 50% or more of the height 126' of the tip 133 above the surface 123 of the bond region 122 or intermetallic layer in contact with the post. The tip of each post typically has a width 135 in a lateral direction 113 which is smaller than the width 137 of the base of the post. The post may also have a waist having a width 139 which is smaller than each of the widths 135, 137 of the tip 133 and the base 141.

The width 135 of the tip can be the same or different in the lateral directions 113, 115 in which the metal foil extends. When the width is the same in the two directions, the width 135 can represent a diameter of the tip. Likewise, the width 137 of the base can be the same or different in lateral directions 113, 115 of the metal foil, and when it is the same, the width 137 can represent a diameter of the base. Similarly, the width 139 of the waist can be the same or different in lateral directions 113, 115 of the metal foil, and when it is the same, the width 139 can represent a diameter of the waist. In one embodiment, the tip can have a first diameter, and the waist can have a second diameter, wherein a difference between the first and second diameters can be greater than 25% of the height of the post extending between the tip and base of the post.

FIG. 4 illustrates the interconnection element after conductive posts 130 are formed by etching completely through the metal foil 124 to expose the underlying bond region 122. In a particular example, the conductive posts can have a height from a few tens of microns and lateral dimensions, e.g., diameter from a few tens of microns. In a particular example, the height and diameter can each be less than 100 microns. The diameter of the posts is less than the lateral dimensions of the conductive pads. The height of each post can be less than or greater than the post's diameter.

Figure 4B:
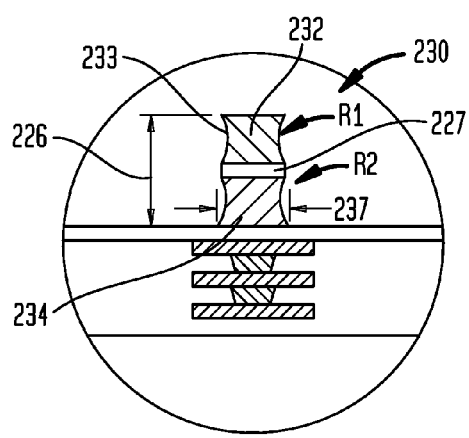
FIG. 4B is a partial fragmentary sectional view illustrating structure of a conductive post formed in accordance with a variation of such embodiment.
Figure 4C:
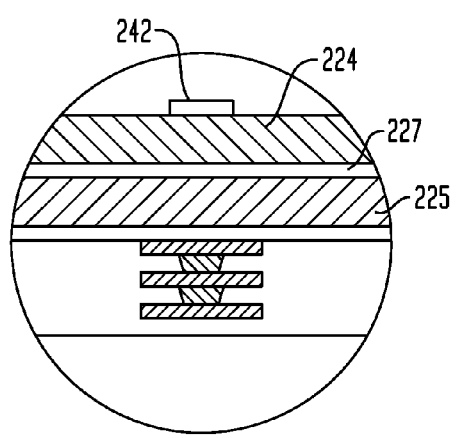
FIG. 4C is a partial fragmentary sectional view further illustrating a stage in formation of an interconnection element in accordance with a variation of an embodiment.

FIG. 4B illustrates an alternative embodiment in which the post 230 is formed with a base having a width 237 which can be narrower in relation to a height 226 of the post than the width 137 of the base when the post is formed as discussed with reference to FIG. 4A. Thus, a post 230 having a greater height to width aspect ratio may be obtained than the post 130 formed as discussed above. In a particular embodiment, the post 230 can be formed by etching portions of a layered structure (FIG. 4C) using a masking layer 242, where the layered structure including a first metal foil 224, a second metal foil 225 and an etch barrier layer 227 sandwiched between the first metal foil and the second metal foil. The resulting post 230 can have an upper post portion 232 and a lower post portion 234 and can have an etch barrier layer 227 disposed between the upper and lower post portions. In one example, the metal foil consists essentially of copper and the etch barrier 227 consists essentially of a metal such as nickel that is not attacked by an etchant that attacks copper. Alternatively, the etch barrier 227 can consist essentially of a metal or metal alloy that can be etched by the etchant used to pattern the metal foil, except that the etch barrier 227 is etched more slowly than the metal foil. In such manner, the etch barrier protects the second metal foil 225 from attack when the first metal foil is being etched in accordance with masking layer 242 to define an upper post portion 232. Then, portions of the etch barrier 227 exposed beyond an edge 233 of the upper post portion 232 are removed, after which the second metal foil 225 is etched, using the upper post portion as a mask.

The resulting post 230 can include a first etched portion having a first edge, wherein the first edge has a first radius of curvature R1. The post 230 also has at least one second etched portion between the first etched portion and the intermetallic layer, wherein the second etched portion has a second edge having a second radius of curvature R2 that is different from the first radius of curvature.

In one embodiment, the upper post portion 232 may be partially or fully protected from further attack when etching the second metal foil to form the lower post portion. For example, to protect the upper post portion, an etch-resistant material can be applied to an edge or edges 233 of the upper post portion prior to etching the second metal foil. Further description and methods of forming etched metal posts similar to the posts 230 shown in FIG. 4B are described in commonly owned U.S. application Ser. No. 11/717,587 filed Mar. 13, 2007, the disclosure of which is incorporated herein by reference.

Figure 4D:
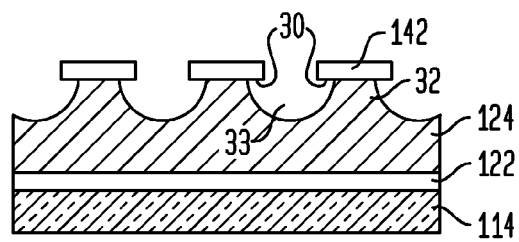
FIGS. 4D, 4E, 4F and 4G are sectional views illustrating stages in formation of an interconnection element in accordance with a variation of an embodiment.

In one example, the starting structure need not include an etch barrier layer sandwiched between first and second metal foils. Instead, the upper post portion can be formed by incompletely etching, e.g., "half-etching" a metal foil, such that projecting portions 32 of the metal foil are defined as well as recesses 33 between the projecting portions where the metal foil has been exposed to the etchant. After exposure and development of a photoresist as a masking layer 142, the foil 124 can be etched as shown in FIG. 4D. Once a certain depth of etching is reached, the etching process is interrupted. For example, the etching process can be terminated after a predetermined time. The etching process leaves first post portions 32 projecting upwardly away from the substrate 114. with recesses 33 defined between the first portions. As the etchant attacks the foil 124, it removes material beneath the edges of masking layer 142, allowing the masking layer to project laterally from the top of the first post portions 32, denoted as overhang 30. The first masking layer 142 remains at particular locations as shown.

Figure 4E:
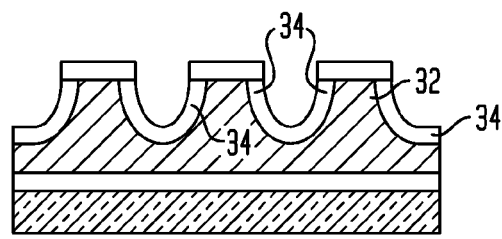

Once the foil 124 has been etched to a desired depth, a second layer of photoresist 34 (FIG. 4E) is deposited onto an exposed surface of the foil 124. In this instance, the second photoresist 34 can be deposited onto the recesses 33 within the foil 124, i.e., at locations where the foil has been previously etched. Thus, the second photoresist 34 also covers the first post portions 32. In one example, an electrophoretic deposition process can be used to selectively form the second layer of photoresist on the exposed surface of the foil 124. In such case, the second photoresist 34 can be deposited onto the foil without covering the first photoresist masking layer 142.

Figure 4F:
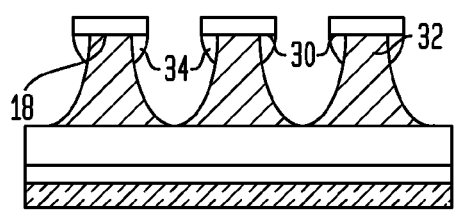

At the next step, the substrate with the first and second photoresists 142 and 34 is exposed to radiation and then the second photoresist is developed. As shown in FIG. 4F, the first photoresist 142 can project laterally over portions of the foil 124, denoted by overhang 30. This overhang 30 prevents the second photoresist 34 from being exposed to radiation and thus prevents it from being developed and removed, causing portions of the second photoresist 34 to adhere to the first post portions 32. Thus, the first photoresist 142 acts as a mask to the second photoresist 34. The second photoresist 34 is developed by washing so as to remove the radiation exposed second photoresist 34. This leaves the unexposed portions of second photoresist 34 on the first post portions 32.

Figure 4G:
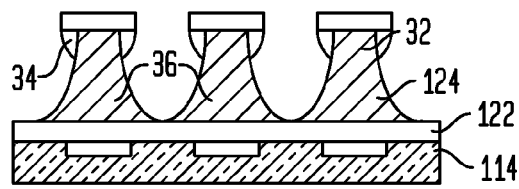

Once portions of the second photoresist 34 have been exposed and developed, a second etching process is performed, removing additional portions of the foil 124, thereby forming second post portions 36 below the first post portions 32 as shown in FIG. 4G. During this step, the second photoresist 34, still adhered to first post portions 32, protects the first post portions 32 from being etched again.

These steps may be repeated as many times as desired to create the preferred aspect ratio and pitch forming third, fourth or nth post portions. The process may be stopped when the bond region 122 or intermetallic layer is reached, such layer which can act as an etch-stop or etch-resistance layer. As a final step, the first and second photoresists 142 and 34, respectively, may be stripped entirely.

In such manner, posts having a shape similar to the shape of posts 230 (FIG. 4B) can be formed, but without requiring an internal etch barrier 227 to be provided between upper and lower post portions as seen in FIG. 4B. Using such method, posts having a variety of shapes can be fabricated, in which the upper post portions and lower post portions can have similar diameters, or the diameter of the upper post portion can be larger or smaller than that of a lower post portion. In a particular embodiment, the diameter of the post can become progressively smaller from tip to base or can become progressively larger from tip to base, by successively forming portions of the posts from the tips to the bases thereof using the above-described techniques.

Figure 5:
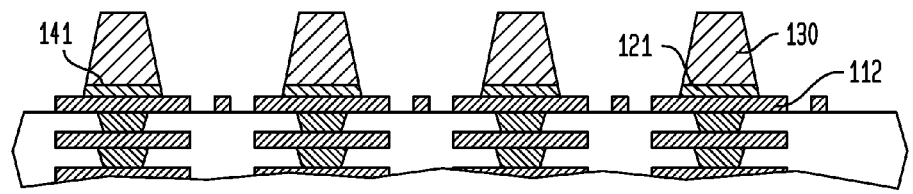
FIG. 5 is a fragmentary sectional view illustrating a stage in a method of fabricating a substrate subsequent to the stage illustrated in FIG. 4.

Next, as illustrated in FIG. 5, portions of the bond region which are exposed between the posts are removed, such as by selective etching, a post-etch cleaning process, or both, such that each post 130 remains firmly bonded to a conductive pad 112 through a remaining portion of the intermetallic layer 121 and a portion of the bond region, if any, which remains. As a result, the bases 141 of the posts which are adjacent to the intermetallic layer or in contact therewith can be aligned with the intermetallic layer, except for some undercut or overcut of the intermetallic layer which can occur within manufacturing tolerances. Also as a result of the foregoing processing, the traces 116 can become exposed between the posts.

Figure 6:
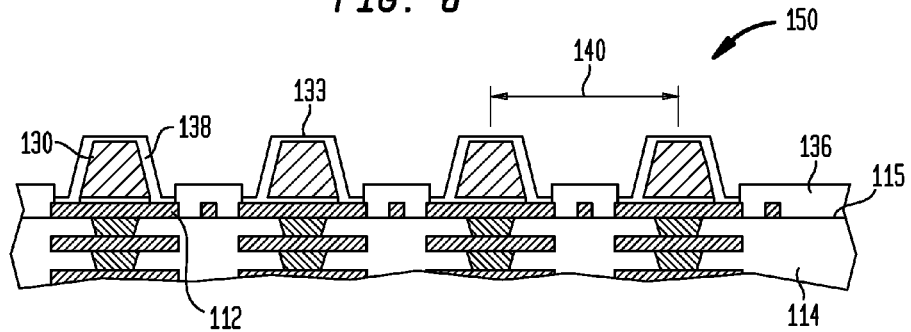
FIG. 6 is a fragmentary sectional view illustrating a completed substrate having protruding conductive posts in accordance with one embodiment.

Subsequently, in the stage illustrated in FIG. 6, a solder mask 136 is applied onto an exposed major surface 115 of the dielectric element 114 and patterned. As a result, the conductive posts 130 and the conductive pads 112 can then be exposed within openings of the solder mask 136. A finish metal 138 containing one or more thin layers of metal such as gold or tin and gold can then be applied to exposed surfaces of the posts 130 and the conductive pads 112, to complete the interconnection element. In the interconnection element 150 depicted in FIG. 6, the tips 133 of the conductive posts have a high degree of planarity because they are formed by etching a single metal foil of uniform thickness. Moreover, the pitch 140 obtained between adjacent posts can be very small, e.g., less than 150 microns, and in some cases even smaller, because the dimensions and shape of each post can be controlled well through the etching process. The interconnection element 150 is now in a form usable to form flip-chip interconnections with a corresponding solder bump array of a microelectronic element, such as a semiconductor chip, for example. Alternatively, a mass or coating of solder or joining metal, e.g., tin, indium or a combination of tin and indium can be formed over the finish metal at least the tips 133, such mass or coating available for forming conductive interconnections with the microelectronic element.

Figure 6A:
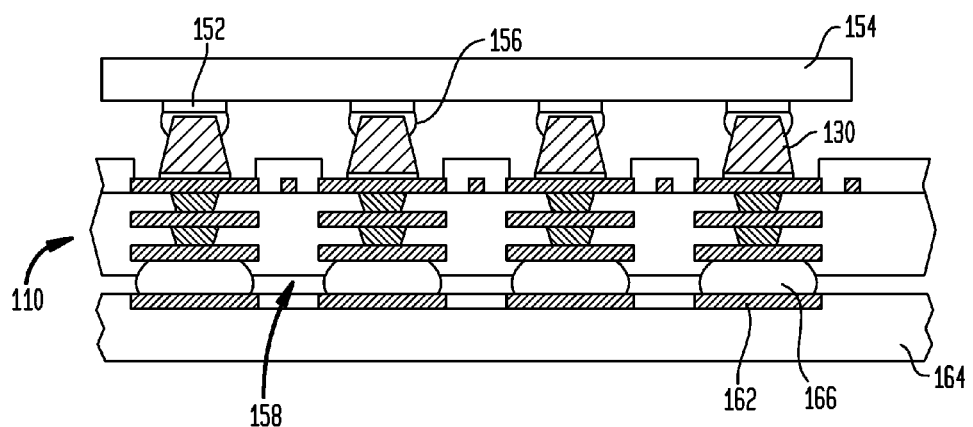

Thus, as shown in FIG. 6A, the posts 130 of the interconnection substrate 110 can be joined with corresponding contacts 152 of a microelectronic element 160 or semiconductor chip, such as by fusing thereto using a solder 156 or other joining metal.

In yet another alternative, the posts 130 of the interconnection element can be joined to contacts of a semiconductor chip without the presence of solder 156, such as by diffusion bonding to corresponding conductive pads or columns exposed at a surface of the semiconductor chip. In one example, the posts 130 of the interconnection element can be joined to contacts of a semiconductor chip using nanoparticles consisting essentially of gold, another metal, or a combination of metals. For example, gold nanoparticles can be applied directly to the downward-facing surface of the pads 152 and/or to the upward-facing surface of the posts 130. The nanoparticles can be selectively stencil printed, screen printed, dispensed, sprayed, dabbed, or brushed onto the pads 152 and/or the posts 130 by an apparatus, as discussed above with respect to including nanoparticles in the bond region 122 shown in FIG. 1.

When the posts 130 of the interconnection substrate 110 are joined to a semiconductor chip, such as a microelectronic element, e.g., integrated circuit ("IC"), the interconnection element may also be electrically connected to a circuit panel 164 or wiring board using a solder 166 or other joining metal. For example, the interconnection element may be connected to such circuit panel 164 at a surface 158 of the interconnection element remote from the posts. In this way, electrically conductive interconnection can be provided between the microelectronic element 154 and the circuit panel 164 through the interconnection element being connected to pads 162 of the circuit panel. If the interconnection element is joined with the microelectronic element 154 and to a circuit panel 164, the posts may also be connected to another microelectronic element or other circuit panel so that the interconnection element can be used to establish connection between multiple microelectronic elements and at least one circuit panel. In yet another example, terminals of the interconnection element may be juxtaposed with interface contacts of a testing jig, such that when the posts are pressed into contact with the contacts 152 of the chip without forming permanent interconnections, electrically conductive connection can be established between the testing jig and the microelectronic element through the interconnection substrate 110.

Figure 7:
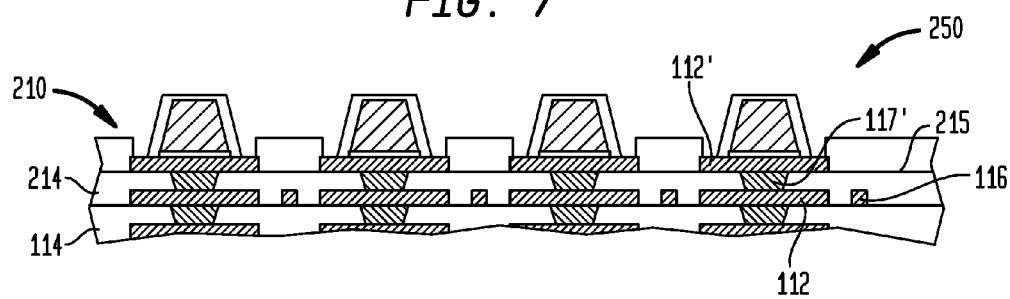
FIG. 7 is a fragmentary sectional view illustrating a completed substrate having protruding conductive posts in accordance with a variation of the embodiment illustrated in FIG. 6.

FIG. 7 illustrates an interconnection element 250 in accordance with an alternative embodiment. As shown therein, no traces are exposed at a major surface 215 of the interconnection element. Instead, traces 116 are disposed below the major surface such that they are covered by the material of the dielectric element 210. Interconnection element 250 can be formed starting from the partially fabricated interconnection substrate 110 (FIG. 1) having conductive pads 112 and traces 116 and depositing a layer 214 of dielectric material thereon. Openings can then be formed in the dielectric layer 214, such as by laser drilling, which can then be electroplated or filled with a conductive paste (e.g., solder paste or silver-filled paste) to form vias 117'. Conductive pads 112' can then be formed which are exposed at the major surface 215 of the dielectric element 210. Processing then continues as described above (FIGS. 1 through 6). One possible advantage of forming the interconnection element in this way is that traces 116 remain protected by the additional dielectric layer 214 during processing. In addition, the solder mask 136 between the conductive pads may not be necessary.

Figure 8:
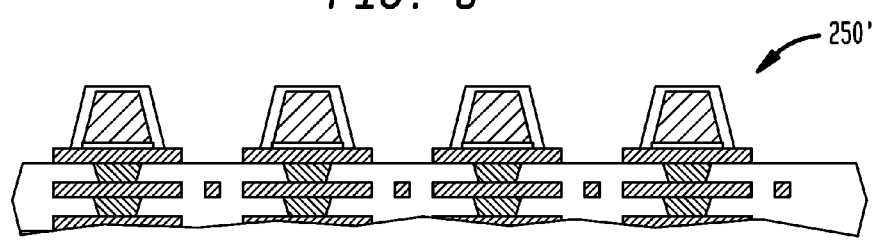
FIG. 8 is a fragmentary sectional view illustrating a completed substrate having protruding conductive posts in accordance with a variation of the embodiment illustrated in FIG. 7.

FIG. 8 depicts an interconnection element 250' similar to that shown in FIG. 7 but in which the step of forming the solder mask has been eliminated.

Figure 9:
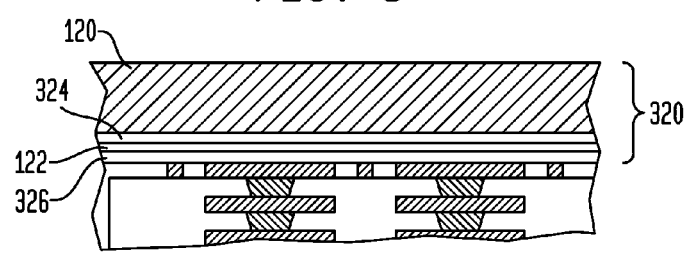
FIGS. 9-10 are fragmentary sectional views illustrating stages in a method of fabricating a substrate having protruding conductive posts in accordance with a variation of the embodiment illustrated in FIGS. 1-6.

In a particular embodiment of the invention as illustrated in FIG. 9, the layered metal structure 320 includes the metal foil 120 and bond region 122 as described above (FIGS. 1, 3), but also includes etch barrier layers 324 and 326. The etch barrier layer 324 includes a material which is not attacked by an etchant which is used to pattern the metal foil. The etch barrier layer 326 includes a material which is not attacked by an etchant or other chemical used to remove portions of the bond region 122. In a particular example, when the metal foil 120 includes copper, the etch barrier layer 324 between the copper foil and the barrier layer can consist essentially of nickel. In this way, the copper foil can be etched with a high degree of selectivity relative to the nickel etch barrier, and thereby protect the bond region and other structure from erosion when the foil is etched. Thereafter, the etch barrier 324 is removed, such as by etching the etch barrier with an appropriate chemistry, such that portions of the bond region become exposed between the posts. The exposed portions of the bond region 122 can then be removed by etching selectively with respect to the second etch barrier 326. With the second etch barrier 326, a relatively thick bond region can be provided which can be patterned by selective etching, with the second etch barrier 326 protecting underlying structure. Finally, after the exposed portions of the bond region are removed, portions of the second etch barrier 326 which are exposed between the posts can be removed.

Figure 10:
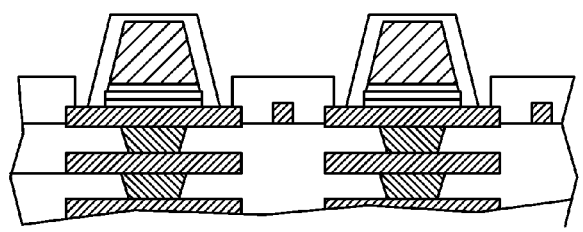

Alternatively, the second barrier layer 326 can function primarily as a diffusion barrier layer to avoid significant diffusion of the bond region into the material of the conductive pads 112. FIG. 10 illustrates an interconnection element 350 completed by a method according to this variation (FIG. 9) of the embodiment.

Figure 11:
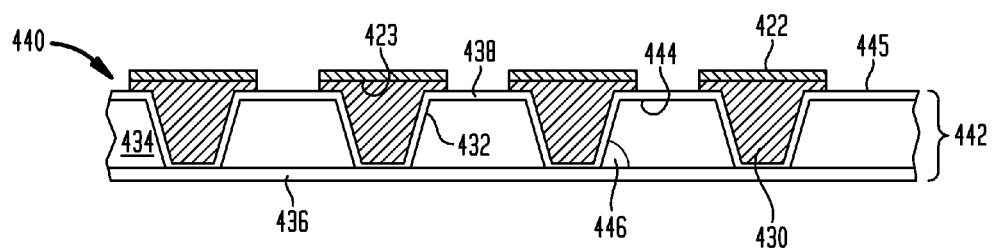
FIG. 11 is a fragmentary sectional view illustrating a stage in a method of fabricating a substrate having protruding conductive posts in accordance with a variation of the embodiment illustrated in FIGS. 1-6; the section taken through line 11-11 of FIG. 12.
Figure 12:
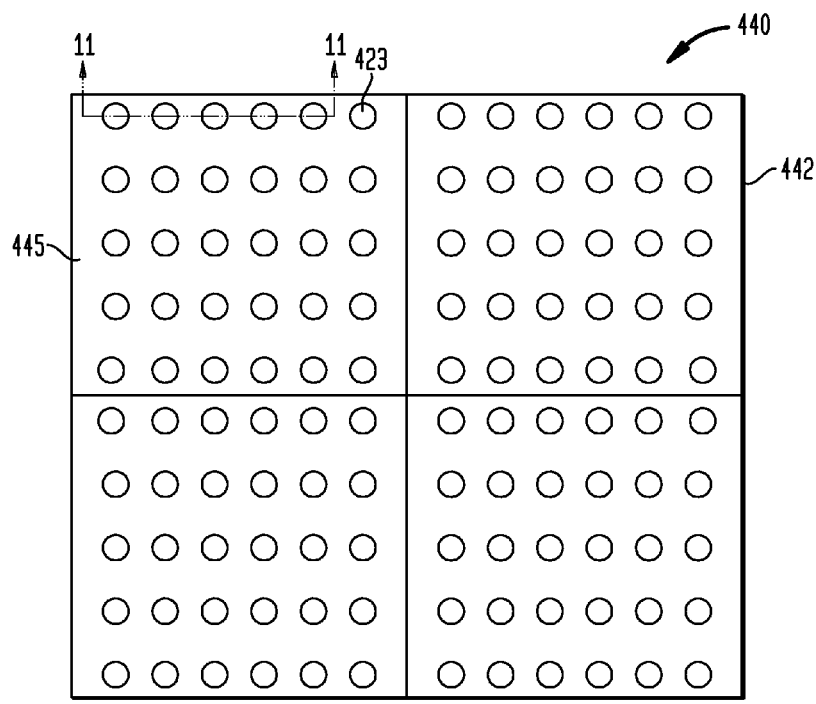
FIG. 12 is a plan view corresponding to FIG. 11.

FIG. 11 is a fragmentary sectional view illustrating an alternative layered metal structure 440 for use in fabricating an interconnection element in accordance with a variation of the embodiment described above (FIGS. 1-6). The layered metal structure 440 includes a plurality of conductive posts 430 which are pre-formed within holes or openings 432 of a mandrel 442. FIG. 12 is a plan view of the layered metal structure 440 corresponding to FIG. 11, showing bases 423 of the conductive posts adjacent to a surface 445 of the mandrel 442.

The mandrel can be fabricated according to methods such as described in commonly owned U.S. application Ser. No. 12/228,890 filed Aug. 15, 2008 entitled "Interconnection Element with Posts Formed by Plating" which names Jinsu Kwon, Sean Moran and Endo Kimitaka as inventors, U.S. application Ser. No. 12/228,896 filed Aug. 15, 2008 entitled "Interconnection Element with Plated Posts Formed on Mandrel" which names Sean Moran, Jinsu Kwon and Endo Kimitaka as inventors and U.S. Provisional Application Nos. 60/964,823 (filed Aug. 15, 2007) and 61/004,308 (filed Nov. 26, 2007) the disclosures of which are hereby incorporated by reference herein.

For example, the mandrel 442 can be formed by etching, laser-drilling or mechanically drilling holes in a continuous foil 434 of copper having a thickness of a few tens of microns to over a hundred microns, after which a relatively thin layer 436 of metal (e.g., a copper layer having a thickness from a few microns to a few tens of microns) is joined to the foil to cover the open ends of the holes. The characteristics of the hole-forming operation can be tailored so as to achieve a desired wall angle 446 between the wall of the hole 432 and the surface of the metal layer 436. In particular embodiments, the wall angle can be acute or can be a right angle, depending upon the shape of the conductive posts to be formed.

As covered by the metal layer 436, the holes are then blind openings. An etch barrier layer 438 then is formed extending along bottoms and walls of the openings and overlying an exposed major surface 444 of the foil. In one example, a layer of nickel can be deposited onto a copper foil as the etch barrier layer 438. Thereafter, a layer of metal is plated onto the etch barrier layer to form posts 430. A series of patterning and deposition steps results in formation of the conductive posts with portions 422 of a bond region (e.g., a bond region consisting essentially of nanoparticles) overlying a base 423 of each post 430.

In another example, the portions 422 of a bond region can include nanoparticles consisting essentially of gold, another metal, or a combination of metals. For example, gold nanoparticles can be applied directly to the bases 423 of the conductive posts 430. The nanoparticles can be selectively stencil printed, screen printed, dispensed, sprayed, dabbed, or brushed onto the bases 423 of the conductive posts 430 by an apparatus, as discussed above with respect to including nanoparticles in the bond region 122 shown in FIG. 1.

Given that the posts 430 are plated onto the etch barrier layer 438, it may be necessary to use a polishing operation on the bases 423 of the posts 430 to improve the coplanarity of the posts 430 before application of the portions 422 of a bond region including nanoparticles. Because portions 422 of a bond region including nanoparticles are much thinner than such portions 422 that are comprised of solder, an increased coplanarity of the posts 430 may be required to form a strong enough bond between the posts 430 and the conductive pads 112 (FIGS. 13 and 14) when nanoparticles are used for portions 422 of a bond region.

Figure 13:
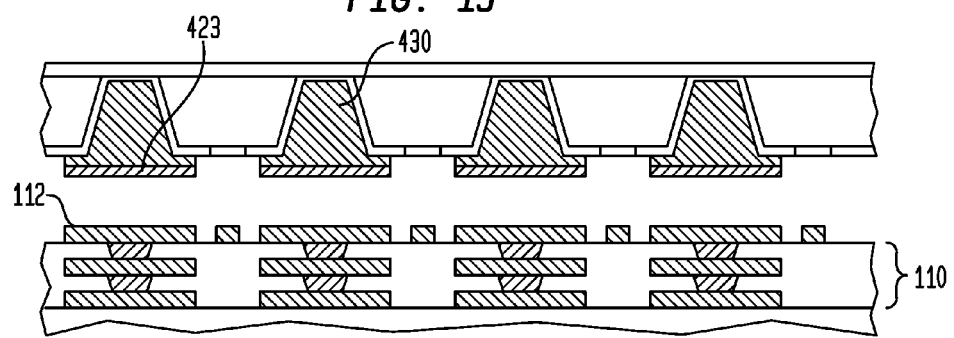
FIGS. 13, 14, 15 and 16 are fragmentary sectional views illustrating stages subsequent to the stage shown in FIGS. 11-12 in a method of fabricating a substrate having protruding conductive posts in accordance with a variation of the embodiment illustrated in FIGS. 1-6.
Figure 14:
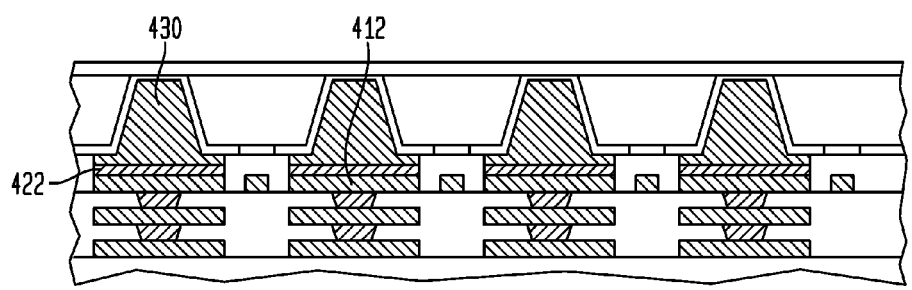

As illustrated in FIG. 13, the layered metal structure 440 now is juxtaposed with a partially fabricated interconnection substrate 110 as described above (FIG. 1), with the bases 423 of the conductive posts 430 adjacent to the conductive pads 112. FIG. 14 illustrates the assembly after the posts are joined with the conductive pads through the bond region portions 422.

Although the portions 422 of a bond region are described as overlying a base 423 of each post 430 before attaching the posts 430 to the respective pads 112, in another example, the bond region portions 422 can be applied to the upward-facing surfaces of the conductive pads 112 in addition to or instead of being applied to the base 423 of each post 430.

Figure 15:
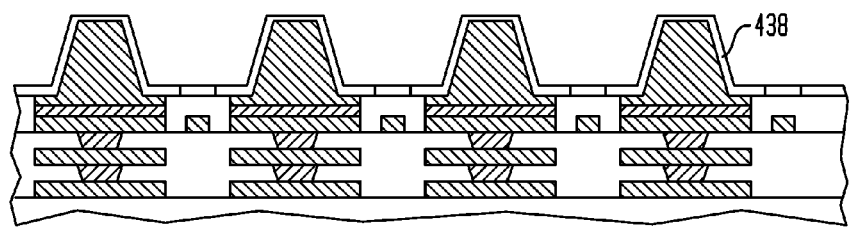

Subsequently, the metal foil 434 and layer 436 of the mandrel are removed as illustrated in FIG. 15, such as by etching a metal of these layers selectively with respect to the etch barrier 438. For example, when the foil 434 and layer 436 consist essentially of copper, they can be etched selectively with respect to an etch barrier 438 consisting essentially of nickel.

Figure 16:
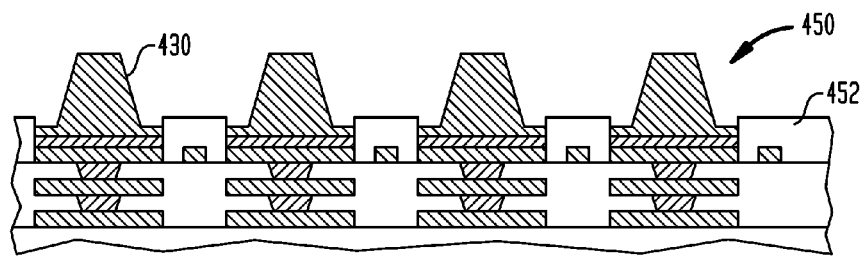

Thereafter, the etch barrier can be removed, and a solder mask 452 applied, resulting in the interconnection element 450 as illustrated in FIG. 16. Subsequent processing can then proceed as described above (FIGS. 1-6) to form a finish metal layer or other joining metal on the posts 430.

Figure 17:
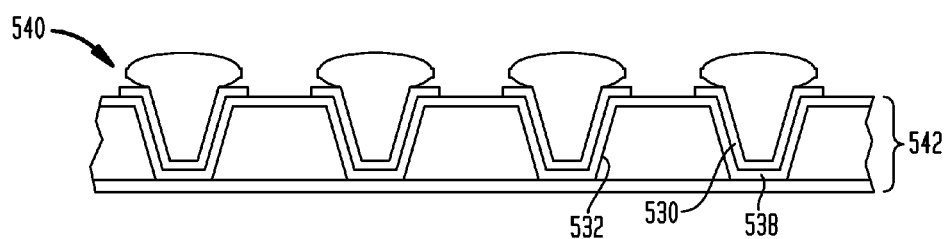
FIGS. 17, 18 and 19 are fragmentary sectional views illustrating stages in a method of fabricating a substrate having protruding conductive posts in accordance with a variation of the embodiment illustrated in FIGS. 11-16.

In a variation of such embodiment (FIGS. 11-16), a layered metal structure 540 (FIG. 17) can be prepared in which conductive posts 530 of a higher melting temperature metal such as copper are electroplated onto walls of the openings 532. In this variation, the posts are formed as hollow elements overlying an etch barrier 538 within the openings 532 of the mandrel 542. A bond material 522, e.g., a joining metal such as tin, indium, a combination of tin and indium, or other material can then be disposed within the hollow posts as shown. Typically, the bond material has a lower melting temperature than the melting temperature of the hollow conductive posts 530.

Figure 18:
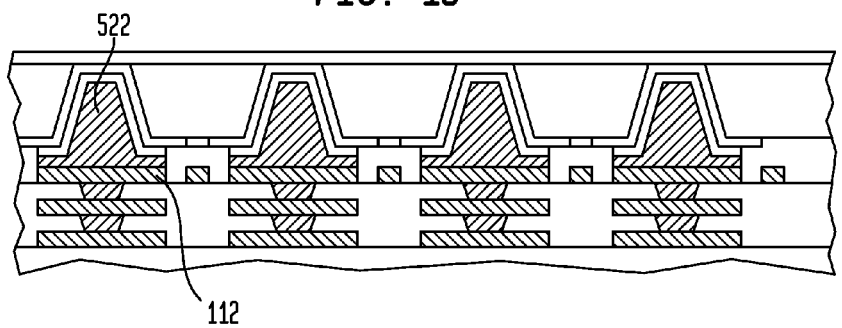
Figure 19:
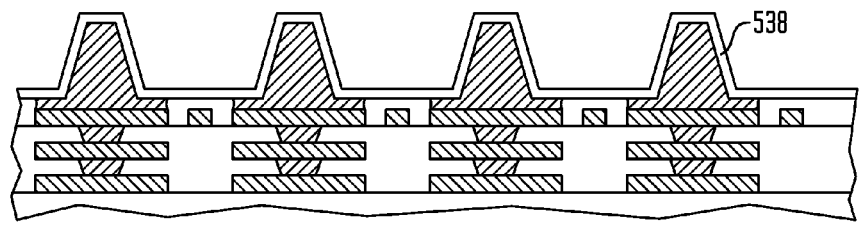

Then, as illustrated in FIG. 18, the bond material 522 within the posts is joined under appropriate conditions with the conductive pads 112. Portions of the mandrel can then be removed by etching selectively with respect to the etch barrier 538, in a manner such as described above (FIGS. 15-16). Processing can then proceed as described above to form a solder mask and finish metal layer.

Figure 20:
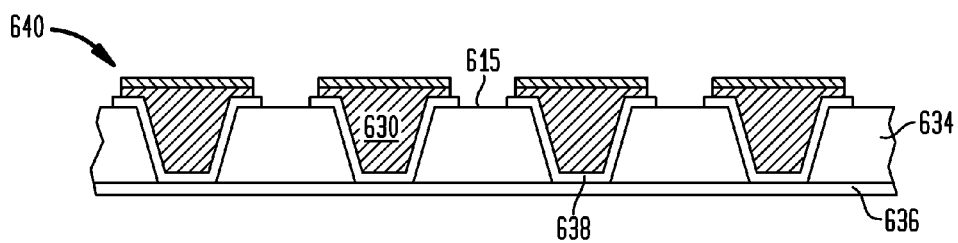
FIG. 20 is a fragmentary sectional view illustrating a layered metal structure for use in a method of fabrication in accordance with a variation of the embodiment illustrated in FIGS. 11-19.

FIG. 20 is a fragmentary sectional view illustrating a layered metal structure 640 utilized in a method of fabrication in accordance with a variation of the above-described embodiments (FIGS. 11-19). In this variation, the mandrel includes a dielectric layer 634 instead of a metal foil, e.g., copper foil, as described above. Metal layer 636 is used as an electrical communing layer when electroplating a metal layer such as copper to form the posts 630 within the openings of the mandrel. In this way, after removing the metal layer 636, the dielectric layer 634 can be removed selectively using a process which can be tailored so as not to affect structure such as traces 116 (FIG. 1) which may be exposed at a surface of the partially fabricated interconnection element. In this way, the etch barrier 638 can be relatively thin and need not cover the entire major surface 615 of the dielectric layer 634.

Figure 21:
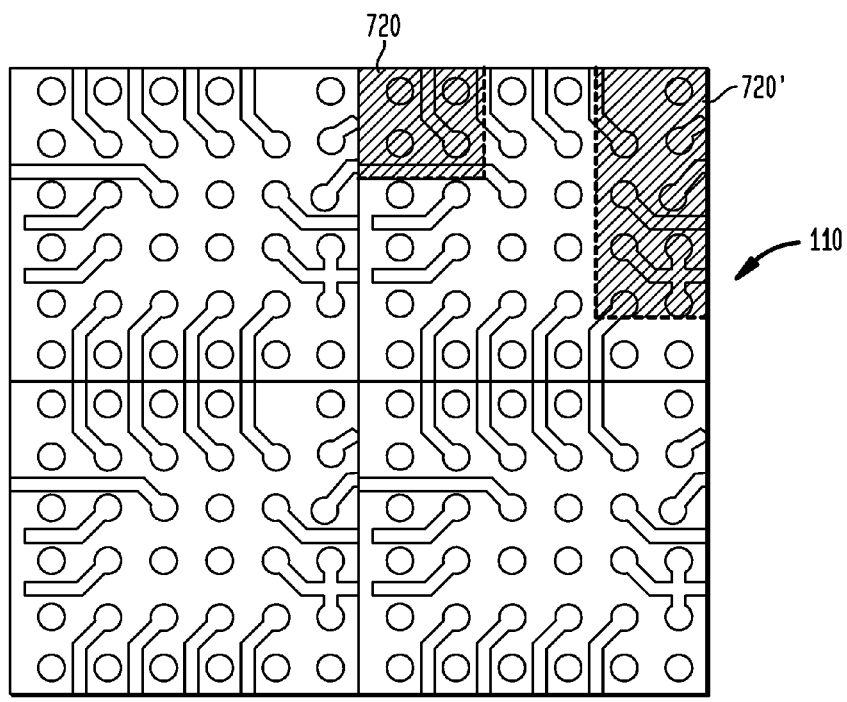
FIG. 21 is a plan view illustrating a method of fabrication in accordance with a variation of an embodiment such as illustrated in one or more of the foregoing described embodiments.

In yet another variation, shown in plan view in FIG. 21, it is noted that it is not necessary for any or all of the above-described methods (FIGS. 1-20) to be practiced with respect to an entirety of a substrate panel, e.g., a square panel having dimensions of 500 millimeters by 500 millimeters. Instead, it is also contemplated that a plurality of separate layered metal structures 720, 720' each being smaller than the interconnection substrate 110 can be joined thereto and processed as described above. For example, a pick-and-place tool can be used to place a layered metal structure as described in the foregoing onto some exposed conductive pads on the substrate panel in particular locations as required. The layered metal structures can then be bonded to the conductive pads in accordance with one or more of the above-described processes. Conductive pads and traces which remain uncovered by any such layered metal structure can be protected from subsequent processing by deposition of an appropriate removable protective layer, e.g., a removable polymer layer. Processing can then proceed in accordance with one or more of the above-described methods.

Figure 22:
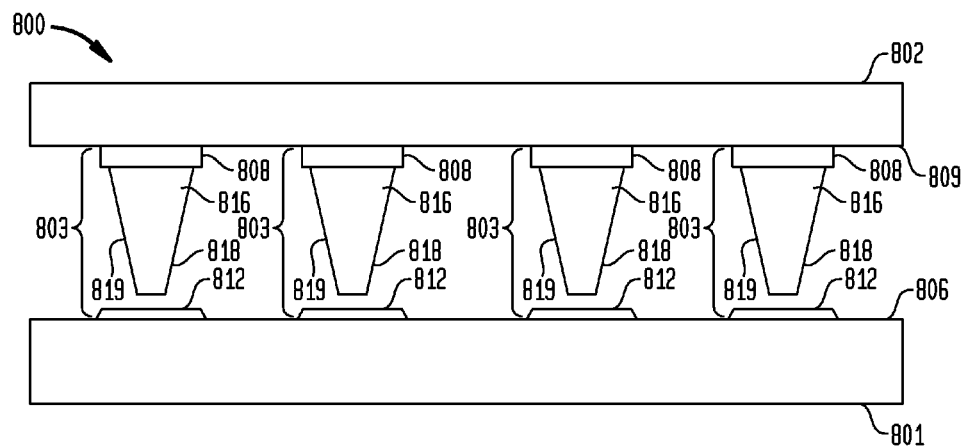
FIG. 22 is a sectional view illustrating a completed microelectronic assembly in accordance with another embodiment.

Reference is now made to FIG. 22, which illustrates a cross-sectional view of an example packaged microelectronic assembly 800 suitable for use with nanoparticle bonding between conductive posts and pads.

As shown, in this variation, the packaged microelectronic assembly 800 includes a substrate 801 such as that shown and described above with respect to FIG. 1. The assembly also includes a microelectronic element 802 in a face down or flip-chip position, and conductive columns 803 adapted for joining the substrate with the microelectronic element. The conductive columns 803 include conductive bond pads 812 that are exposed at a top surface 806 of the substrate 801 and are aligned with conductive bumps or solid metal posts or substantially rigid posts 816 protruding above a front surface 809 of the microelectronic element 802.

The microelectronic element 802 has a front surface 809. The microelectronic element 802 preferably is a semiconductor chip or the like. For example, the microelectronic element may be a bare die. The posts 816 may extend from bond pads 808 exposed at the front surface 809 of the microelectronic element 802.

The posts 816 may be any type of conductive posts, including any type of conductive posts disclosed herein with reference to other embodiments (e.g., dual-etched posts). For example, the posts 816 may have any shape, including frustoconical. The base and tip of each of the conductive posts 816 may be substantially circular or have a different shape, e.g., oblong. More specifically, the posts 816 extending from the microelectronic element 802 may be similar to the etched posts 130 shown in FIGS. 4, 4A, 4B, 5, 6, or 6A, among others, and can be formed by the processes described above with respect to FIGS. 1 through 6A.

In a particular embodiment, the conductive pads 812 and the posts 816 can be made from a malleable material with minimal resistance or spring-back as, for example, substantially pure gold. In a particular embodiment, the conductive pads 812 and the posts 816 can be comprised of copper, and each post 816 can be configured to be fused directly to a corresponding conductive pad 812 without the presence of a solder or tin between the conductive posts.

The conductive columns 803 preferably were formed using nanoparticles (e.g., gold nanoparticles) to join the corresponding conductive pads 812 and posts 816, thereby creating the conductive columns 803 that extend from the microelectronic element 802 to the substrate 801.

In a particular embodiment, before joining of the posts 816 to the conductive pads 812, a layer of a paste including nanoparticles consisting essentially of gold, tin, copper, another metal, or a combination of metals can be spread over the top surface 806 of the substrate 801 and/or the front surface 809 of the microelectronic element 802. A paste containing the nanoparticles can be spread over the top surface 806 of the substrate 801 and/or the front surface 809 of the microelectronic element 802 to form a continuous layer, or a paste containing the nanoparticles can be deposited in discrete locations (e.g., the tips 818 of the posts 816) to form a substantially discontinuous layer.

To remove excess nanoparticles that are not on the upward-facing surface of the conductive pads 812 or the tip 818 of the posts 816, a photoresist or other mask layer can be patterned by photolithography to form an etching mask overlying the nanoparticles, similar to the method shown and described with reference to FIG. 1B. The nanoparticle layer can then be selectively etched from the top surface 806 and/or the front surface 809 in locations not covered by the etching mask, to remove most or all of the nanoparticles that are not on the conductive pads 812 or the posts 816.

In a particular embodiment, the nanoparticles (e.g., gold nanoparticles) can be applied directly to the exposed upward-facing surfaces of the conductive pads 812 or to the tips 818 of the posts 816 rather than being spread over the top surface 806 of the substrate 801 and/or the front surface 809 of the microelectronic element 802. In such an embodiment, the nanoparticles can be selectively stencil printed, screen printed, dispensed, sprayed, dabbed, or brushed onto the conductive pads 812 and/or the posts 816 by an apparatus. For example, the nanoparticles can be propelled through a nozzle by an aerosol onto the conductive pads 812 and/or the posts 816. The location of the nozzle in lateral directions 113, 115 (e.g., FIG. 3) can be controlled, for example, by one or more stepper motors, similar to that of an electronically controlled printing apparatus, e.g., an inkjet printer, or an electronically controlled wirebonder apparatus.

In a particular embodiment, the nanoparticles can contact or be applied to edge surfaces 819 of the posts 816 as well as to the tips 818 of the posts 816.

In embodiments wherein the posts 816 have been plated onto the microelectronic element 802, it may be necessary to use a polishing operation on the tips 818 of the posts 816 to improve the coplanarity of the posts 816 before application of the nanoparticles to the posts 816 or before bonding of the posts 816 to conductive pads 812 to which nanoparticles have been applied. Because the thickness of the deposited nanoparticles can be much smaller than a layer of solder or other conventional metal bonding materials, an increased coplanarity of the posts 816 may be required to join the posts 816 with the conductive pads 812 when nanoparticles are used.

After nanoparticles have been applied to the upward-facing surface of the conductive pads 812 or the tip 818 of the posts 816, the posts 816 can be joined to the conductive pads 812 by moving the posts 816 to contact the conductive pads 812, and heating the microelectronic assembly 800 to the melting temperature of the nanoparticles, a temperature which may be much lower than, for example, hundreds of ° C. lower than bulk materials.

Figure 23:
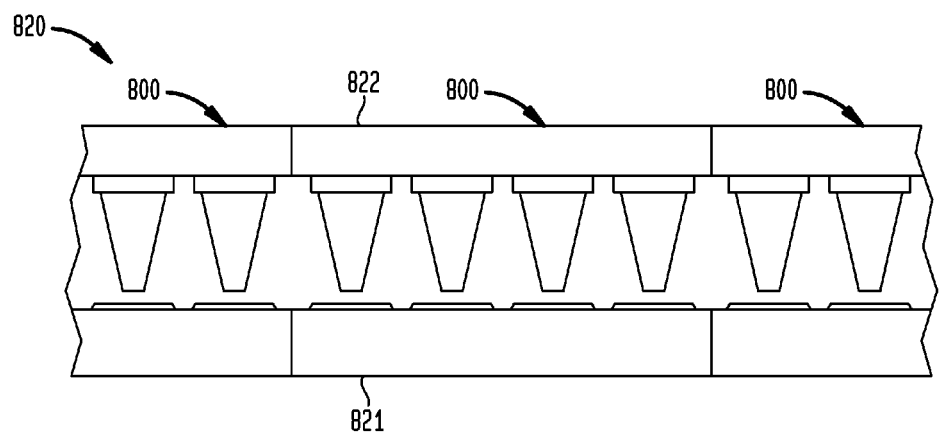
FIG. 23 is a sectional view illustrating a completed microelectronic assembly including a plurality of microelectronic assemblies as shown in FIG. 22 in accordance with another embodiment.

Reference is now made to FIG. 23, which illustrates a cross-sectional view of an example packaged microelectronic assembly 820 suitable for use with nanoparticle bonding between conductive posts and pads.

As shown, in this variation, the packaged microelectronic assembly 820 includes a substrate panel 821 comprising substrate portions such as that shown and described above with respect to FIG. 1. The assembly also includes a microelectronic element wafer 822 in a face down or flip-chip position. The microelectronic assembly 820 includes a plurality of microelectronic assemblies 800 as shown and described with reference to FIG. 22.

In particular embodiments, the substrate panel 821 can be bonded to the microelectronic element wafer 822 with nanoparticles, and after the panel 821 is bonded to the wafer 822, the microelectronic assembly 820 can be remain intact or can be separated into individual microelectronic assemblies 800 (e.g., using a laser to cut the panel 821 and the wafer 822).

Reference is now made to FIG. 24, which illustrates a cross-sectional view of an example packaged microelectronic assembly 840 suitable for use with nanoparticle bonding between conductive posts and pads.

The packaged microelectronic assembly 840 shown in FIG. 23 is substantially the same as the packaged microelectronic assembly 800 shown in FIG. 22, except that conductive columns 843 include conductive bumps or posts 854 extending from the top surface 846 of a substrate 841 (rather than from the microelectronic element) and conductive bond pads 848 that are exposed at a front surface 849 of a microelectronic element 842 (rather than from the substrate).

The conductive columns 843 preferably were formed using nanoparticles (e.g., gold, tin, or copper nanoparticles) to join the corresponding conductive pads 848 and posts 854, thereby creating the conductive columns 843 that extend from the microelectronic element 842 to the substrate 841.

Reference is now made to FIG. 25, which illustrates a cross-sectional view of an example packaged microelectronic assembly 860 suitable for use with nanoparticle bonding between conductive posts.

The packaged microelectronic assembly 860 shown in FIG. 25 is substantially the same as the packaged microelectronic assembly 800 shown in FIG. 22 and the packaged microelectronic assembly 800 shown in FIG. 23, except that conductive columns 863 include conductive bumps or posts 874 extending from the top surface 866 of a substrate 861 and conductive bumps or posts 876 extending from the front surface 869 of a microelectronic element 862.

In one example, the conductive columns 863 are formed using nanoparticles (e.g., gold, tin, or copper nanoparticles) to join the corresponding conductive posts 874 and 876, thereby creating the conductive columns 863 that extend from the microelectronic element 862 to the substrate 861.

After nanoparticles have been applied to the tips of the posts 874 and/or 876, the posts 874 can be joined to the posts 876 by moving the posts 874 to contact the posts 876, and heating the microelectronic assembly 860 to the melting temperature of the nanoparticles.

Figure 26:
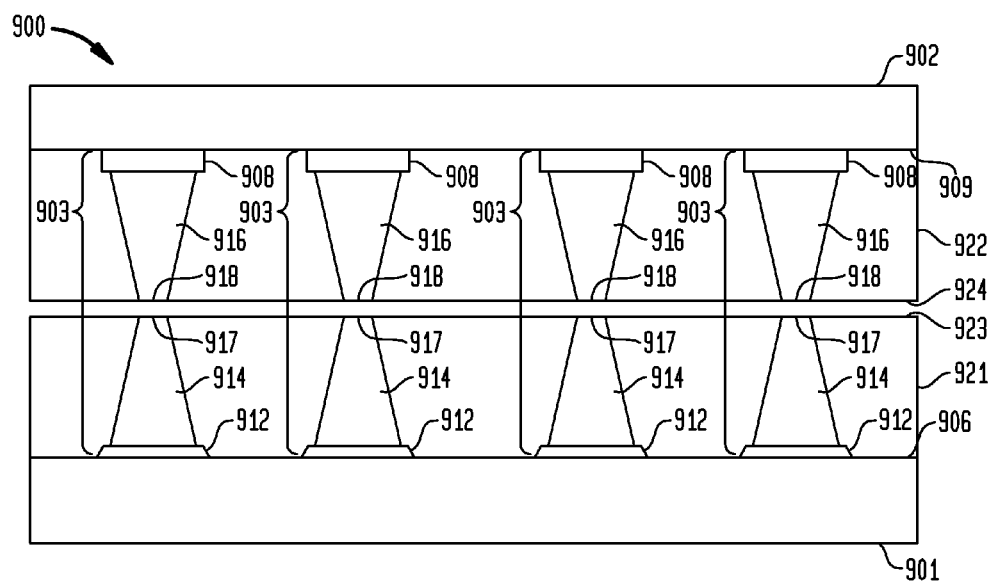
FIG. 26 is a sectional view illustrating a completed microelectronic assembly in accordance with another embodiment.

Reference is now made to FIG. 26, which illustrates a cross-sectional view of an example packaged microelectronic assembly 900 suitable for use with nanoparticle bonding between conductive posts.

The packaged microelectronic assembly 900 shown in FIG. 26 is substantially the same as the packaged microelectronic assembly 860 shown in FIG. 25, except that the microelectronic assembly 900 includes a first dielectric region 921 extending between conductive posts 914 extending from a substrate 901 and a second dielectric region 922 extending between conductive posts 916 extending from a microelectronic element 902. The dielectric regions 921 and 922 can be no flow underfills. The dielectric regions 921 and 922 can electrically isolate the posts 914 from each other and the posts 916 from each other.

As shown in FIG. 26, the dielectric region 921 has an outer surface 923 that is approximately coplanar with a plane defined by the tips 917 of the conductive posts 914. Also, the dielectric region 922 has an outer surface 924 that is approximately coplanar with a plane defined by the tips 918 of the conductive posts 916.

To planarize the outer surfaces 923 and 924 to the respective tips 917 and 918, dielectric regions 921 and 922 can be applied that expend beyond the respective tips 917 and 918, and the dielectric regions 921 and 922 (and optionally the respective tips 917 and 918) can be lapped, for example, to produce respective planar surfaces at the outer surface 923 and the tips 917 and at the outer surface 924 and the tips 918.

Before the substrate 901 is joined to the microelectronic element 902, the tips 917 and/or 918 of the respective conductive posts 914 and 916 can be recessed beneath the respective outer surfaces 923 and 924. In one example, the tips 917 and/or 918 can be etched to reduce the height thereof by approximately 100 microns, thereby recessing the tips 917 and/or 918 beneath the plane of the respective outer surfaces 923 and 924. Recessing the tips 917 and/or 918 can provide space for application to the tips of a paste containing nanoparticles, such that when the tips 917 and 918 are mated together, the nanoparticle paste does not substantially squeeze out from the tips 917 and/or 918 onto the outer surfaces 923 and 924. If too much nanoparticle paste squeezes out from the tips 917 and/or 918 onto the respective outer surfaces 923 and 924, the presence of the nanoparticle paste can reduce or prevent bonding of the outer surface 923 to the outer surface 924.

Referring now to FIG. 27, after nanoparticles have been applied to the tips 917 and 918 of the respective posts 914 and/or 916, the posts 914 can be joined to the posts 916 by moving the posts 914 to contact the posts 916, and heating the microelectronic assembly 900 to the melting temperature of the nanoparticles, thereby creating a joined microelectronic assembly 900'. The nanoparticles can diffuse into the posts 914 and 916 to join the posts 914 and 916 and create conductive columns 903. Also during the heating of the microelectronic assembly 900, the outer surface 923 of the dielectric region 921 can be joined to the outer surface 924 of the dielectric region 922 to create a single dielectric region 925. In a particular embodiment, a flow underfill can be applied (instead of a no flow underfill) to surround the posts 914 and 916 to create the single dielectric region 925 after joining of the posts 914 and 916 to create the conductive columns 903.

Although the embodiments shown in FIGS. 22-27 describe substrates 801, 821, 841, 861, and 901 being joined to respective microelectronic elements 802, 822, 842, 862, and 902 (e.g., a flip-chip assembly), in some embodiments, the substrates 801, 821, 841, 861, and 901 can be a first component and the microelectronic elements 802, 822, 842, 862, and 901 can be a second component, wherein the first component and the second component can be any one of a microelectronic element including active semiconductor devices, a semiconductor substrate such as a silicon chip carrier or a silicon interposer, a dielectric substrate such as a dielectric interposer, or a microelectronic package that includes a microelectronic element and a substrate. For example, the elements 801, 821, 841, 861, and 901 may be microelectronic elements that are joined to respective substrates 802, 822, 842, 862, and 902. In some embodiments, the elements 801, 821, 841, 861, and 901 may be dielectric substrates that are joined to respective dielectric substrates 802, 822, 842, 862, and 902 (e.g., a package on package assembly). In other embodiments, the elements 801, 821, 841, 861, and 901 may be microelectronic elements that are joined to respective microelectronic elements 802, 822, 842, 862, and 902 (e.g., a die stacking assembly).

Figure 28:
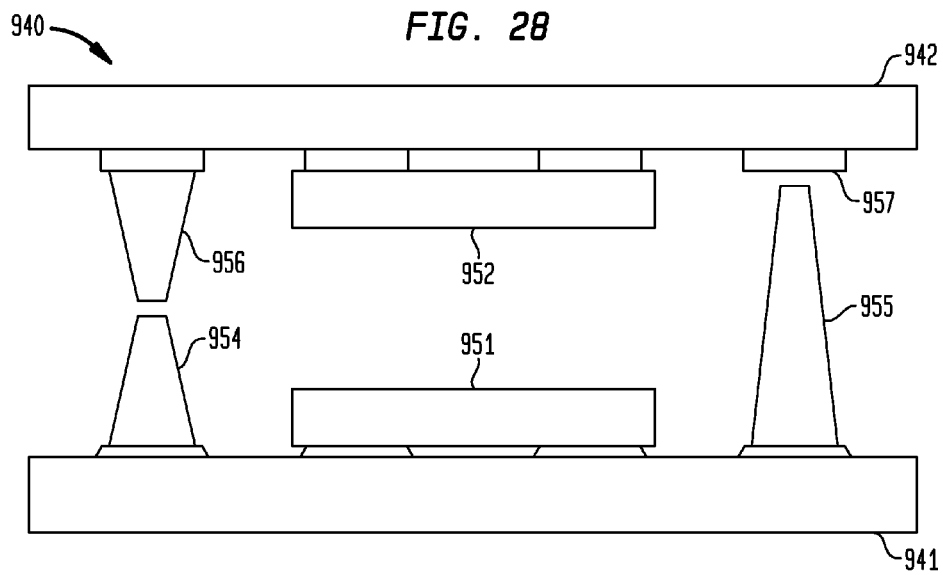
FIG. 28 is a sectional view illustrating a completed microelectronic assembly in accordance with another embodiment.

In one example, FIG. 28 illustrates a package on package assembly 940. In the assembly 940, a first substrate 941 including a microelectronic element 951 can be joined to a second substrate 942 including a microelectronic element 952. The first substrate 941 can include a plurality of conductive elements 954 extending from the first substrate that can be joined, for example, using nanoparticles or a paste containing nanoparticles, to an opposing plurality of conductive elements 956 extending from the second substrate 942. In a particular embodiment, the first substrate 941 can include a plurality of conductive posts 955 extending from the first substrate that can be joined, for example, using nanoparticles or a paste containing nanoparticles, to an opposing plurality of conductive pads 957 exposed at the second substrate 942. Before joining, the nanoparticles can be applied, for example, to either or both of the conductive elements 954 and 956, or to either or both of the conductive posts 955 and the conductive pads 957.

Figure 29:
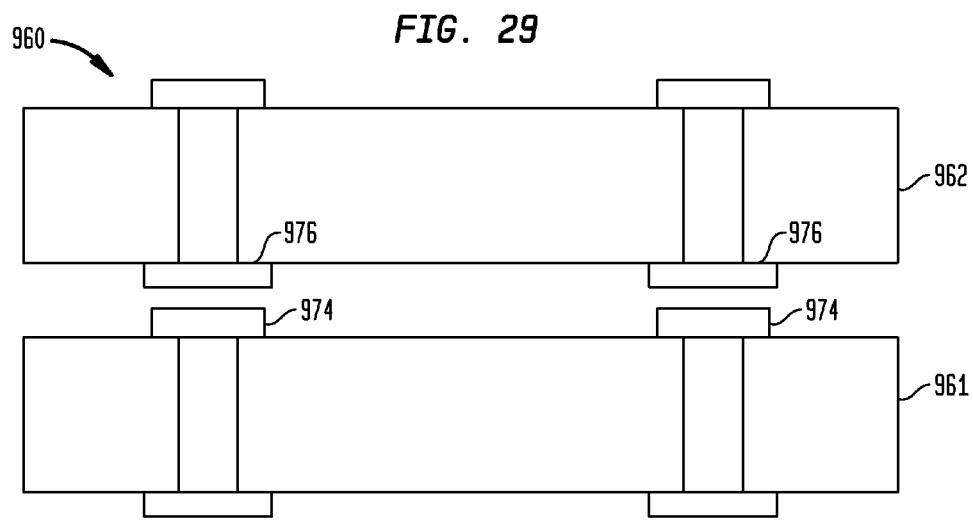
FIG. 29 is a sectional view illustrating a completed microelectronic assembly in accordance with another embodiment.

In another example, FIG. 29 illustrates a die stacking assembly 960. In the assembly 960, a first microelectronic element 961 can be joined to a second microelectronic element 962. The first microelectronic element 961 includes a plurality of conductive elements 974 extending from the first microelectronic element that can be joined, for example, using nanoparticles or a paste containing nanoparticles to an opposing plurality of conductive contacts 976 extending from the second microelectronic element 962. Before joining, the nanoparticles can be applied, for example, to either or both of the conductive elements 974 and 976.

Although the embodiments shown in FIGS. 22-29 discuss using nanoparticles to join the tips of posts extending from a substrate or pads exposed at the top surface of a substrate to the tips of posts extending from a microelectronic element or pads exposed at the front surface of a microelectronic element, nanoparticles can also be used in embodiments similar to those shown in FIGS. 22-29 to join the bases of posts to pads exposed at the top surface of a substrate or to pads exposed at the front surface of a microelectronic element, in a manner similar to that discussed with respect to FIGS. 1, 6, 6A, and 11.

The conductive pads 812 and the posts 816 shown in FIG. 22 and FIG. 23, the posts 854 and the conductive pads 848 shown in FIG. 24, the posts 874 and 876 shown in FIG. 25, the posts 914 and 916 shown in FIGS. 26 and 27, the conductive elements 954 and 956 and posts 955 and pads 957 shown in FIG. 28, and the conductive elements 974 and 976 shown in FIG. 29 may be made from any electrically conductive material, such as copper, copper alloys, gold and combinations thereof. For example, the posts may be comprised of copper with a layer of gold at the surfaces of the posts.

The dimensions of the posts 816 shown in FIG. 22 and FIG. 23, the posts 854 shown in FIG. 24, the posts 874 and 876 shown in FIG. 25, the posts 914 and 916 shown in FIGS. 26 and 27, and the conductive elements 954 and 956 and posts 955 and pads 957 shown in FIG. 28 can vary over a significant range, but most typically the height of each post extending from the front surfaces of the substrate and the microelectronic element is at least 30 microns and can extend up to 300 microns. These posts may have a height (approximately perpendicular to the front surfaces of the substrate and the microelectronic element, respectively) that is greater than its diameter or width (approximately parallel to the front surfaces of the substrate and the microelectronic element, respectively). However, the height may also be smaller than the width, such as at least half the size of the width.

The conductive posts or conductive pads of any of the microelectronic elements or substrates described herein can be joinable with conductive elements exposed at a surface of at least one of a microelectronic element, an interconnection component joinable with a microelectronic element, or a substrate of a microelectronic package that includes a microelectronic element.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 30:
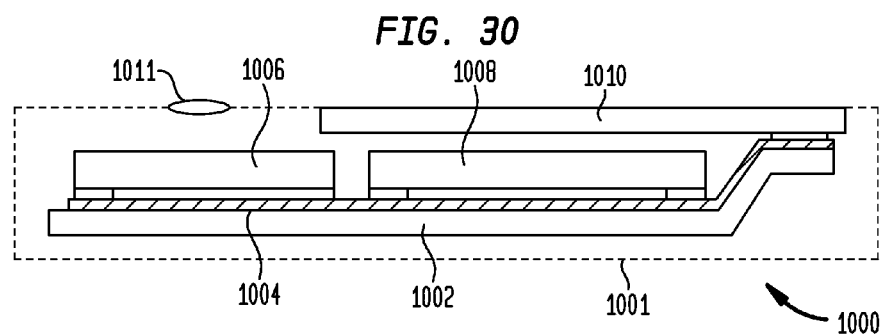
FIG. 30 is a schematic depiction of a system according to one embodiment of the invention.

The structures discussed above can be utilized in construction of diverse electronic systems. For example, a system 1000 in accordance with a further embodiment of the invention includes a structure 1006 as described above in conjunction with other electronic components 1008 and 1010. In the example depicted, component 1008 is a semiconductor chip whereas component 1010 is a display screen, but any other components can be used. Of course, although only two additional components are depicted in FIG. 30 for clarity of illustration, the system may include any number of such components. The structure 1006 as described above may be, for example, a microelectronic unit as discussed above in connection with FIG. 1A, or a structure incorporating plural microelectronic units as discussed with reference to FIG. 16. In a further variant, both may be provided, and any number of such structures may be used.

Structure 1006 and components 1008 and 1010 are mounted in a common housing 1001, schematically depicted in broken lines, and are electrically interconnected with one another as necessary to form the desired circuit. In the exemplary system shown, the system includes a circuit panel 1002 such as a flexible printed circuit board, and the circuit panel includes numerous conductors 1004, of which only one is depicted in FIG. 30, interconnecting the components with one another. However, this is merely exemplary; any suitable structure for making electrical connections can be used.

The housing 1001 is depicted as a portable housing of the type usable, for example, in a cellular telephone or personal digital assistant, and screen 1010 is exposed at the surface of the housing. Where structure 1006 includes a light-sensitive element such as an imaging chip, a lens 1011 or other optical device also may be provided for routing light to the structure. Again, the simplified system shown in FIG. 30 is merely exemplary; other systems, including systems commonly regarded as fixed structures, such as desktop computers, routers and the like can be made using the structures discussed above.

Processes for electrically connecting a microelectronic element such as a semiconductor chip to a substrate, e.g., chip carrier, can be as further described in U.S. patent application Ser. No. 12/286,102, which is incorporated by reference herein.

Some or all of the above-described methods can be applied to form a component in which posts that extend from contacts, e.g., bond pads of a microelectronic element which includes a semiconductor chip. Thus, the resulting product of the above-described methods can be a semiconductor chip having at least one of active or passive devices thereon and having posts which extend away from conductive elements, e.g., pads, exposed at a surface of the chip. In a subsequent process, the posts extending away from the chip surface can be joined with contacts of a component such as a substrate, interposer, circuit panel, etc., to form a microelectronic assembly. In one embodiment, such microelectronic assembly can be a packaged semiconductor chip or can include a plurality of semiconductor chips packaged together in a unit with or without electrical interconnections between the chips.

The methods disclosed herein for forming posts joined with conductive elements of a substrate can be applied to a microelectronic substrate, such as a single semiconductor chip or can be applied simultaneously to a plurality of individual semiconductor chips which can be held at defined spacings in a fixture or on a carrier for simultaneous processing. Alternatively, the methods disclosed herein can be applied to a microelectronic substrate or element including a plurality of semiconductor chips which are attached together in form of a wafer or portion of a wafer to perform processing as described above simultaneously with respect to a plurality of semiconductor chips on a wafer-level, panel-level or strip-level scale.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of making an assembly, comprising:
   (a) applying metallic nanoparticles having long dimensions smaller than 100 nanometers to exposed surfaces of conductive elements of at least one of a first component and a second component, each component being any of a microelectronic element having active semiconductor devices therein, a dielectric element, a semiconductor element, or a microelectronic assembly including a microelectronic element and a substrate attached thereto, wherein the conductive elements of at least one of the first component and the second component include substantially rigid posts having top surfaces projecting a height above the surface of the respective component and edge surfaces extending at substantial angles away from the top surfaces thereof;
   (b) juxtaposing the conductive elements of the first component with the conductive elements of the second component with the metallic nanoparticles disposed therebetween, and
   (c) elevating a temperature at least at interfaces of the juxtaposed conductive elements to a joining temperature at which the metallic nanoparticles cause metallurgical joints to form between the juxtaposed conductive elements.

2. The method of claim 1, wherein step (a) is performed by applying the nanoparticles selectively to the exposed surfaces of the conductive elements of at least one of the first or second components.

3. The method of claim 1, wherein the metal nanoparticles consist essentially of at least one selected from the group consisting of gold, tin, and copper.

4. The method of claim 1, wherein the joining temperature is above room temperature but substantially below 200° C.

5. The method of claim 1, wherein at least one of the first or second components is the microelectronic element including active semiconductor devices, wherein the joining temperature is not more than 150° C.

6. The method of claim 1, wherein the first component is the microelectronic element including active semiconductor devices.

7. The method of claim 6, wherein the second component is the microelectronic element including active semiconductor devices.

8. The method of claim 6, wherein the second component is the semiconductor substrate.

9. The method of claim 6, wherein the second component is the dielectric substrate.

10. The method of claim 1, wherein at least prior to step (c) the metallic nanoparticles overlie edge surfaces of the posts.

11. The method of claim 1, wherein the conductive elements of both of the first component and the second component include the substantially rigid posts having top surfaces projecting a height above the surface of the respective component, wherein step (b) is performed with the metallic nanoparticles at least disposed between the top surfaces of the substantially rigid posts of the first and second components.

12. The method of claim 11, further comprising, after step (c), forming an underfill dielectric region between juxtaposed surfaces of the first and second components.

13. A method of making an assembly, comprising:
(a) applying metallic nanoparticles having long dimensions smaller than 100 nanometers to exposed surfaces of conductive elements of at least one of a first component and a second component, each component being any of a microelectronic element having active semiconductor devices therein, a dielectric element, a semiconductor element, or a microelectronic assembly including a microelectronic element and a substrate attached thereto, wherein the conductive elements of at least one of the first component and the second component include substantially rigid posts having top surfaces projecting a height above the surface of the respective component and edge surfaces extending at substantial angles away from the top surfaces thereof;
(b) juxtaposing the conductive elements of the first component with the conductive elements of the second component with the metallic nanoparticles disposed therebetween,
(c) elevating a temperature at least at interfaces of the juxtaposed conductive elements to a joining temperature at which the metallic nanoparticles cause metallurgical joints to form between the juxtaposed conductive elements; and
(d) prior to step (a), applying a no flow underfill dielectric region between the posts.

14. The method of claim 13, further comprising, prior to step (a), planarizing the no flow underfill dielectric region with the top surfaces of the posts.

15. The method of claim 14, further comprising, prior to step (a), etching the top surfaces of the posts such that the top surfaces become recessed below a plane defined by a surface of the no flow underfill dielectric region.

16. A method of making an assembly, comprising:
(a) applying metallic nanoparticles having long dimensions smaller than 100 nanometers to exposed surfaces of conductive elements of at least one of a first component and a second component, each component being any of a microelectronic element having active semiconductor devices therein, a dielectric element, a semiconductor element, or a microelectronic assembly including a microelectronic element and a substrate attached thereto, wherein the conductive elements of at least one of the first component and the second component include substantially rigid posts having top surfaces projecting a height above the surface of the respective component and edge surfaces extending at substantial angles away from the top surfaces thereof;
(b) juxtaposing the conductive elements of the first component with the conductive elements of the second component with the metallic nanoparticles disposed therebetween,
(c) elevating a temperature at least at interfaces of the juxtaposed conductive elements to a joining temperature at which the metallic nanoparticles cause metallurgical joints to form between the juxtaposed conductive elements; and
(d) prior to step (a), forming a first no flow underfill dielectric region between the posts of the first component and forming a second no flow underfill dielectric region between the posts of the second component.

17. The method of claim 16, wherein step (c) includes joining the first and second no flow underfill dielectric regions.

18. The method of claim 16, further comprising, prior to step (a), planarizing a surface of the first no flow underfill dielectric region with the top surfaces of the posts of the first component, and planarizing a surface of the second no flow underfill dielectric region with the top surfaces of the posts of the second component.

19. The method of claim 18, further comprising, prior to step (b), etching the top surfaces of the posts of either or both of the first component and the second component, such that the top surface of each etched post becomes recessed below a plane defined by a surface of the respective no flow underfill dielectric region.

* * * * *